United States Patent
Lee et al.

(10) Patent No.: US 11,693,284 B2
(45) Date of Patent: Jul. 4, 2023

(54) DISPLAY PANEL AND METHOD OF REPAIRING THE SAME

(71) Applicant: Samsung Display Co., Ltd., Yongin-si (KR)

(72) Inventors: Yonghee Lee, Suwon-si (KR); Daesuk Kim, Seongnam-si (KR); Kyungho Kim, Seongnam-si (KR); Dong-Yoon Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/853,674

(22) Filed: Apr. 20, 2020

(65) Prior Publication Data

US 2020/0249535 A1    Aug. 6, 2020

Related U.S. Application Data

(62) Division of application No. 15/689,710, filed on Aug. 29, 2017, now Pat. No. 10,656,484.

(30) Foreign Application Priority Data

Dec. 2, 2016    (KR) .................. 10-2016-0163687

(51) Int. Cl.
*G02F 1/1362* (2006.01)
*G02F 1/1368* (2006.01)
(Continued)

(52) U.S. Cl.
CPC ...... *G02F 1/136259* (2013.01); *G02F 1/1368* (2013.01); *G02F 1/134336* (2013.01);
(Continued)

(58) Field of Classification Search
None
See application file for complete search history.

(56) References Cited

U.S. PATENT DOCUMENTS

| 5,132,819 A | 7/1992 | Noriyama et al. |
| 5,910,830 A * | 6/1999 | Nam .................. G02F 1/1362 |
| | | 349/158 |

(Continued)

FOREIGN PATENT DOCUMENTS

| CN | 101174067 A | 5/2008 |
| CN | 102867823 A | 1/2013 |

(Continued)

OTHER PUBLICATIONS

European Search Report corresponding to EP Application No. 17204808.4, dated Mar. 15, 2018, 10 pages.

(Continued)

*Primary Examiner* — Shan Liu
(74) *Attorney, Agent, or Firm* — Innovation Counsel LLP

(57) ABSTRACT

A display panel includes gate lines, data lines, switching elements connected to the gate lines and the data lines, pixel electrodes connected to the switching elements and markers. The pixel electrode includes first, second third and fourth areas which are divided by a horizontal central line and a vertical central line. The first, second, third and fourth areas correspond to an upper-left portion, an upper-right portion, a lower-left portion and a lower-right portion of a central point of the pixel electrode. When the pixel electrode is disposed between first and second data lines and connected to the first data line, the marker is disposed in one of the first and third areas. When the pixel electrode is disposed between the first and second data lines and connected to the second data line, the marker is disposed in one of the second and fourth areas.

15 Claims, 13 Drawing Sheets

(51) Int. Cl.
*G02F 1/1343* (2006.01)
*H01L 21/66* (2006.01)
*H01L 27/12* (2006.01)
*G09G 3/20* (2006.01)

(52) U.S. Cl.
CPC ......... *G02F 1/136286* (2013.01); *G09G 3/20* (2013.01); *H01L 22/22* (2013.01); *H01L 27/124* (2013.01); *G02F 1/136263* (2021.01); *G02F 2201/123* (2013.01); *G09G 2300/0426* (2013.01); *G09G 2330/08* (2013.01); *G09G 2330/10* (2013.01)

(56) References Cited

U.S. PATENT DOCUMENTS

| | | | | |
|---|---|---|---|---|
| 6,030,265 | A | * | 2/2000 | Inada .................. G02F 1/1362 445/24 |
| 7,580,108 | B2 | | 8/2009 | Chang et al. |
| 9,019,464 | B2 | | 4/2015 | Yoon et al. |
| 9,885,930 | B2 | | 2/2018 | Wang et al. |
| 10,283,027 | B2 | | 5/2019 | Ren |
| 2006/0290841 | A1 | * | 12/2006 | Kwon .................. G02F 1/1362 349/110 |
| 2007/0057257 | A1 | * | 3/2007 | Kim .................. G02F 1/134336 257/59 |
| 2007/0085797 | A1 | | 4/2007 | Kim |
| 2007/0159436 | A1 | | 7/2007 | Fukami et al. |
| 2008/0116501 | A1 | | 5/2008 | Lin et al. |
| 2009/0310047 | A1 | | 12/2009 | Shin et al. |
| 2011/0175885 | A1 | | 7/2011 | Shirouzu |
| 2011/0216261 | A1 | * | 9/2011 | Han .................. G02F 1/134336 29/846 |
| 2012/0033170 | A1 | * | 2/2012 | Kim .................. G02F 1/13439 349/139 |
| 2013/0169521 | A1 | * | 7/2013 | Lee .................. G06F 3/0321 345/156 |
| 2014/0204326 | A1 | | 7/2014 | Wu et al. |
| 2015/0009442 | A1 | * | 1/2015 | Lee .................. G02F 1/133707 349/43 |
| 2015/0062516 | A1 | * | 3/2015 | Jung .................. G02F 1/13624 349/123 |
| 2015/0154932 | A1 | * | 6/2015 | Lee .................. G09G 3/3655 345/206 |
| 2015/0163968 | A1 | * | 6/2015 | Lee .................. G02F 1/133707 427/532 |
| 2015/0185546 | A1 | * | 7/2015 | Lee .................. G02F 1/13363 349/33 |
| 2015/0187290 | A1 | * | 7/2015 | No .................. G09G 3/20 345/694 |
| 2015/0331267 | A1 | * | 11/2015 | Lee .................. G02F 1/133788 445/6 |
| 2016/0139473 | A1 | * | 5/2016 | Chang .................. H01L 27/1255 438/4 |
| 2016/0147119 | A1 | | 5/2016 | Chang et al. |
| 2016/0147124 | A1 | | 5/2016 | Su et al. |
| 2016/0275890 | A1 | | 9/2016 | Ra et al. |
| 2016/0320674 | A1 | * | 11/2016 | Seo .................. G02F 1/1368 |
| 2016/0358562 | A1 | | 12/2016 | Du et al. |
| 2016/0370636 | A1 | * | 12/2016 | Huang .................. G02F 1/136286 |
| 2017/0097546 | A1 | | 4/2017 | Lazo Martinez et al. |
| 2017/0139294 | A1 | | 5/2017 | Kim |
| 2017/0227826 | A1 | | 8/2017 | Heo |

FOREIGN PATENT DOCUMENTS

| | | | |
|---|---|---|---|
| CN | 103135297 | A | 6/2013 |
| CN | 103149755 | A | 6/2013 |
| CN | 103293806 | A | 9/2013 |
| CN | 104898343 | A | 9/2015 |
| CN | 105789220 | A | 7/2016 |
| JP | H04-80723 | A | 3/1992 |
| KR | 10-0477131 | B1 | 7/2005 |
| KR | 10-2006-0028970 | A | 4/2006 |
| KR | 10-2007-0041988 | A | 4/2007 |
| KR | 10-2015-0076750 | A | 7/2015 |
| KR | 20150076750 | A * | 7/2015 |
| KR | 10-2016-0021353 | A | 2/2016 |
| KR | 10-2016-0033804 | A | 3/2016 |

OTHER PUBLICATIONS

Chinese Office Action Report, Application No. 201711257820.9 dated Sep. 27, 2021, 7 pages.

\* cited by examiner

DISPLAY PANEL AND METHOD OF REPAIRING THE SAME

PRIORITY STATEMENT

This application is a divisional application of U.S. patent application Ser. No. 15/689,710 filed Aug. 29, 2017, which claims priority under 35 U.S.C. § 119 to Korean Patent Application No. 10-2016-0163687, filed on Dec. 2, 2016 in the Korean Intellectual Property Office KIPO, the contents of which are herein incorporated by reference in their entireties.

BACKGROUND

1. Field

Exemplary embodiments of the present inventive concept relate to a display panel and a method of repairing the display panel. More particularly, exemplary embodiments of the present inventive concept relate to a display panel including markers having relatively different positions in pixels and a method of repairing the display panel.

2. Description of the Related Art

Generally, a display apparatus includes a display panel and a display panel driver. The display panel includes a plurality of gate lines, a plurality of data lines and a plurality of pixels. The display panel driver includes a gate driver and a data driver. The gate driver outputs gate signals to the gate lines. The data driver outputs data voltages to the data lines.

When a defective pixel is generated among the pixels of the display panel, a portion of an element of the defective pixel may be cut or a portion of an element of the defective pixel may be connected to an element of another pixel to repair the defective pixel.

The structure of the data line, the gate line and the pixel becomes complex to improve the display characteristics of the display panel. In the complex connecting structure, the cut required portion of the pixel may not be easily shown to repair the defective pixel.

SUMMARY

Exemplary embodiments of the present inventive concept provide a display panel including markers having relatively different positions in pixels to easily repair a defective pixel.

Exemplary embodiments of the present inventive concept also provide a method of repairing the display panel.

In an exemplary embodiment of a display panel according to the present inventive concept, the display panel includes a plurality of gate lines, a plurality of data lines, a plurality of switching elements, a plurality of pixel electrodes and a plurality of markers. The switching elements are connected to the gate lines and the data lines. The pixel electrodes are connected to the switching elements. The pixel electrode includes a first area, a second area, a third area and a fourth area which are divided by a horizontal central line and a vertical central line. The first area corresponds to an upper-left portion of a central point of the pixel electrode. The second area corresponds to an upper-right portion of the central point of the pixel electrode. The third area corresponds to a lower-left portion of the central point of the pixel electrode. The fourth area corresponds to a lower-right portion of the central point of the pixel electrode. A pixel includes a switching electrode, a pixel electrode and a marker. When the pixel electrode is disposed between a first data line and a second data line and connected to the first data line through the switching element, the marker is disposed in one of the first area and the third area. When the pixel electrode is disposed between the first data line and the second data line and connected to the second data line through the switching element, the marker is disposed in one of the second area and the fourth area.

In an exemplary embodiment, the display panel may include a first pixel electrode connected to a first gate line and the second data line through a first switching element and a second pixel electrode disposed adjacent to the first pixel electrode in a first direction and connected to a second gate line and the second data line through a second switching element. A first marker of the first pixel electrode may be disposed in the second area. A second marker of the second pixel electrode may be disposed in the fourth area.

In an exemplary embodiment, the display panel may include a third pixel electrode disposed adjacent to the second pixel electrode in the first direction and connected to the first gate line and a third data line through a third switching element and a fourth pixel electrode disposed adjacent to the third pixel electrode in the first direction and connected to the second gate line and the third data line through a fourth switching element. A third marker of the third pixel electrode may be disposed in the second area. A fourth marker of the fourth pixel electrode may be disposed in the fourth area.

In an exemplary embodiment, the display panel may include a fifth pixel electrode disposed adjacent to the fourth pixel electrode in the first direction and connected to the second gate line and a fourth data line through a fifth switching element and a sixth pixel electrode disposed adjacent to the fifth pixel electrode in the first direction and connected to the first gate line and the fourth data line through a sixth switching element. A fifth marker of the fifth pixel electrode may be disposed in the fourth area. A sixth marker of the sixth pixel electrode may be disposed in the second area.

In an exemplary embodiment, the display panel may include a seventh pixel electrode disposed adjacent to the first pixel electrode in a second direction and connected to a third gate line and the first data line through a seventh switching element and an eighth pixel electrode disposed adjacent to the seventh pixel electrode in the first direction and connected to a fourth gate line and the first data line through an eighth switching element. A seventh marker of the seventh pixel electrode may be disposed in the first area. An eighth marker of the eighth pixel electrode may be disposed in the third area.

In an exemplary embodiment, the display panel may include a ninth pixel electrode disposed adjacent to the eighth pixel electrode in the first direction and connected to the third gate line and the second data line through a ninth switching element and a tenth pixel electrode disposed adjacent to the ninth pixel electrode in the first direction and connected to the fourth gate line and the second data line through a tenth switching element. A ninth marker of the ninth pixel electrode may be disposed in the first area. A tenth marker of the tenth pixel electrode may be disposed in the third area.

In an exemplary embodiment, the display panel may include an eleventh pixel electrode disposed adjacent to the tenth pixel electrode in the first direction and connected to the fourth gate line and the third data line through an eleventh switching element and a twelfth pixel electrode disposed adjacent to the eleventh pixel electrode in the first direction and connected to the third gate line and the third data line through a twelfth switching element. An eleventh marker of the eleventh pixel electrode may be disposed in the third area. A twelfth marker of the twelfth pixel electrode may be disposed in the first area.

In an exemplary embodiment of a display panel according to the present inventive concept, the display panel includes a gate layer, a data layer, a pixel layer and a marker. The gate layer includes a gate pattern including a gate line and a gate electrode connected to the gate line and a storage pattern spaced apart from the gate pattern. The data layer includes a data line, a source electrode connected to the data line and a drain electrode spaced apart from the source electrode. The pixel layer includes a pixel pad portion connected to the drain electrode through a contact hole, a pixel connecting portion extending from the pixel pad portion and a pixel electrode connected to the pixel pad portion through the pixel connecting portion. The marker has a relatively different position according to a position of the pixel electrode in the display panel. The marker overlaps the pixel electrode.

In an exemplary embodiment, the marker may be disposed in the storage pattern.

In an exemplary embodiment, the storage pattern may include a first extending portion extending in a horizontal direction and a second extending portion connected to the first extending portion and extending in a vertical direction. The marker may be protruded from the first extending portion and spaced apart from the second extending portion.

In an exemplary embodiment, the marker may be protruded from the first extending portion toward inside of the pixel electrode.

In an exemplary embodiment, the marker may be disposed in one of a first area, a second area, a third area and a fourth area which are divided by a horizontal central line of the pixel electrode and a vertical central line of the pixel electrode.

In an exemplary embodiment, when the marker is disposed in the first area, a first cutting line may be disposed between a closest source electrode and a closest data line from a central point of the pixel electrode in a first diagonal direction which is toward the first area from the central point. When the marker is disposed in the second area, the first cutting line may be disposed between a closest source electrode and a closest data line from the central point of the pixel electrode in a second diagonal direction which is toward the second area from the central point. When the marker is disposed in the third area, the first cutting line may be disposed between a closest source electrode and a closest data line from the central point of the pixel electrode in a third diagonal direction which is toward the third area from the central point. When the marker is disposed in the fourth area, the first cutting line may be disposed between a closest source electrode and a closest data line from the central point of the pixel electrode in a fourth diagonal direction which is toward the fourth area from the central point.

In an exemplary embodiment, the pixel electrode may include a first bar portion extending in the vertical direction and overlapping the vertical central line, a second bar portion extending in the horizontal direction and overlapping the horizontal central line and a connecting branch connecting the first bar portion and the pixel connecting portion.

In an exemplary embodiment, when the marker is disposed in an upper side with respect to the horizontal central line of the pixel electrode, the connecting branch may be disposed at an upper portion of the pixel electrode and a second cutting line is disposed below the connecting branch on the first bar portion. When the marker is disposed in a lower side with respect to the horizontal central line of the pixel electrode, the connecting branch may be disposed at a lower portion of the pixel electrode and the second cutting line is disposed above the connecting branch on the first bar portion.

In an exemplary embodiment. The display panel may include a pixel repeating group including twelve pixels in two pixel rows and six pixel columns and repeated in the display panel. The pixel repeating group includes a first pixel row including first to sixth pixels sequentially disposed and a second pixel row including seventh to twelfth pixels sequentially disposed. The first pixel may be connected to a first gate line and a second data line. The second pixel may be connected to a second gate line and the second data line. The third pixel may be connected to the first gate line and a third data line. The fourth pixel may be connected to the second gate line and the third data line. The fifth pixel may be connected to the second gate line and a fourth data line. The sixth pixel may be connected to the first gate line and the fourth data line. The seventh pixel may be connected to a third gate line and a first data line. The eighth pixel may be connected to a fourth gate line and the first data line. The ninth pixel may be connected to the third gate line and the second data line. The tenth pixel may be connected to the fourth gate line and the second data line. The eleventh pixel may be connected to the fourth gate line and the third data line. The twelfth pixel may be connected to the third gate line and the third data line.

In an exemplary embodiment. A first marker of the first pixel may be disposed in the second area. A second marker of the second pixel may be disposed in the fourth area. A third marker of the third pixel may be disposed in the second area. A fourth marker of the fourth pixel may be disposed in the fourth area. A fifth marker of the fifth pixel may be disposed in the fourth area. A sixth marker of the sixth pixel may be disposed in the second area. A seventh marker of the seventh pixel may be disposed in the first area. An eighth marker of the eighth pixel may be disposed in the third area. A ninth marker of the ninth pixel may be disposed in the first area. A tenth marker of the tenth pixel may be disposed in the third area. An eleventh marker of the ninth pixel may be disposed in the third area. A twelfth marker of the twelfth pixel may be disposed in the first area.

In an exemplary embodiment, the marker may be disposed in one of a first area and a second area which are divided by a vertical central direction.

In an exemplary embodiment, the pixel electrode may include a low pixel electrode disposed at an upper portion of the pixel electrode and a high pixel electrode disposed at a lower portion of the pixel electrode. The pixel pad portion may include a low pixel pad portion configured to apply a data voltage to the low pixel electrode and a high pixel pad portion configured to apply the data voltage to the high pixel electrode. The pixel connecting portion may include a low pixel connecting portion connecting the low pixel electrode and the low pixel pad portion and a high pixel connecting portion connecting the high pixel electrode and the high pixel pad portion. The low pixel connecting portion may be disposed at one of a left side with respect to the high pixel electrode and a right side with respect to the high pixel electrode according to a position of the pixel.

In an exemplary embodiment, when the first area is the left side with respect to the vertical central line of the pixel electrode and the marker is disposed in the first area, a portion of the low pixel electrode at the left side with respect to the high pixel electrode may be cut. When the second area is the right side with respect to the vertical central line of the pixel electrode and the marker is disposed in the second area, a portion of the low pixel electrode at the right side with respect to the high pixel electrode may be cut.

In an exemplary embodiment of a method of repairing a display panel, the method includes forming a marker having a relatively different position in a pixel electrode according to a position of the pixel electrode of the display panel and cutting between a source electrode and a data line or a portion of the pixel electrode based on the position of the marker. The marker overlaps the pixel electrode. The display panel includes a gate layer including a gate line, a gate electrode and a storage pattern, a data layer including the data line, the source electrode and a drain electrode and a pixel layer including the pixel electrode.

In an exemplary embodiment, the marker may be disposed in the storage pattern.

In an exemplary embodiment, the storage pattern may include a first extending portion extending in a horizontal direction and a second extending portion connected to the first extending portion and extending in a vertical direction. The marker may be protruded from the first extending portion and spaced apart from the second extending portion.

According to the display panel and the method of repairing the display panel, the display panel includes markers having relatively different positions in pixels to easily repair a defective pixel. Thus, the productivity of the display panel may increase. The manufacturing cost of the display panel may be reduced.

BRIEF DESCRIPTION OF THE DRAWINGS

The above and other features and advantages of the present inventive concept will become more apparent by describing in detailed exemplary embodiments thereof with reference to the accompanying drawings, in which.

DETAILED DESCRIPTION OF THE INVENTIVE CONCEPT

Hereinafter, the present inventive concept will be explained in detail with reference to the accompanying drawings.

Figure 1:
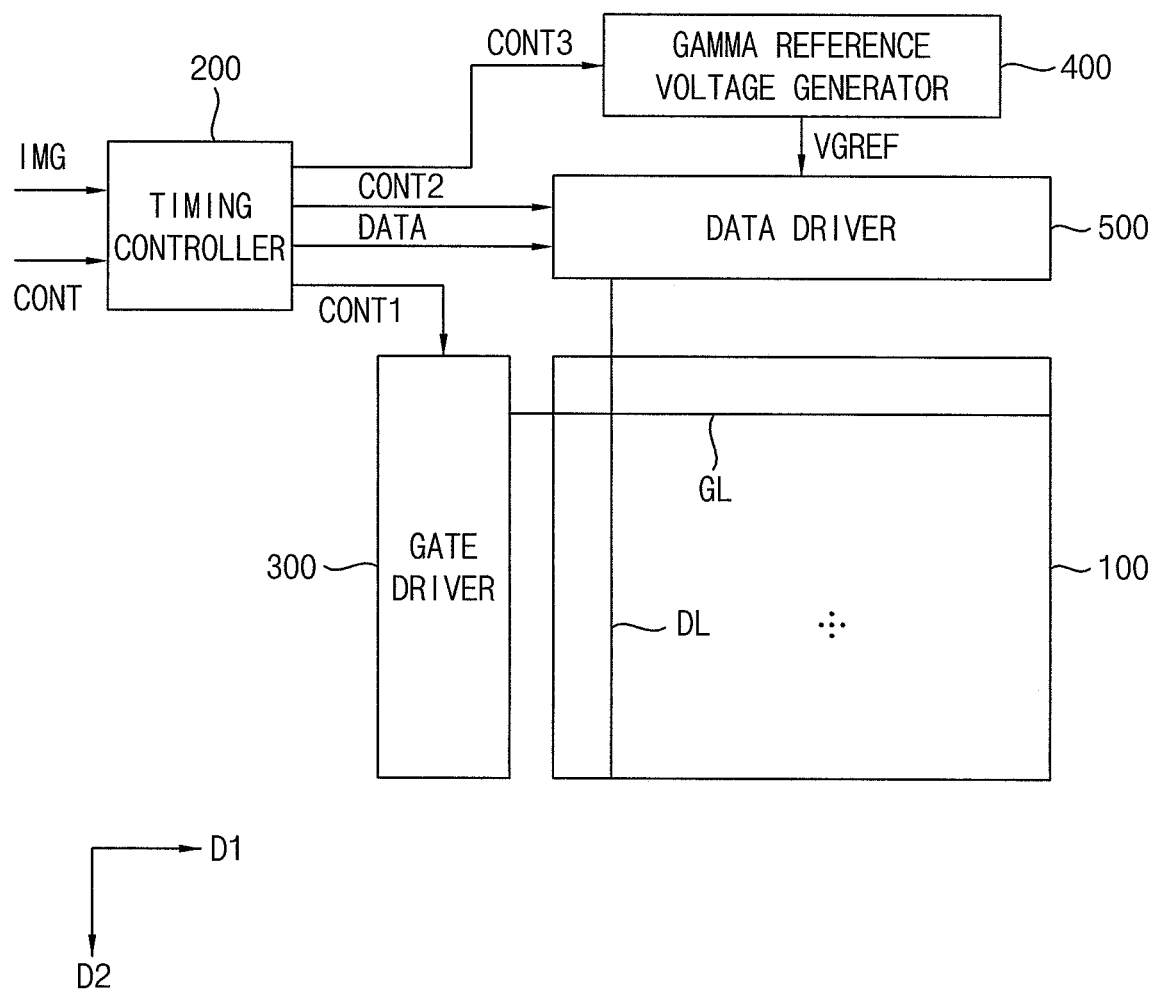
FIG. 1 is a block diagram illustrating a display apparatus according to an exemplary embodiment of the present inventive concept.

FIG. 1 is a block diagram illustrating a display apparatus according to an exemplary embodiment of the present inventive concept.

Referring to FIG. 1, the display apparatus includes a display panel 100 and a display panel driver. The display panel driver includes a timing controller 200, a gate driver 300, a gamma reference voltage generator 400 and a data driver 500.

The display panel 100 includes a plurality of gate lines GL, a plurality of data lines DL and a plurality of pixels electrically connected to the gate lines GL and the data lines DL. The gate lines GL extend in a first direction D1 and the data lines DL extend in a second direction D2 crossing the first direction D1.

Each pixel may include a switching element, a liquid crystal capacitor and a storage capacitor. The liquid crystal capacitor and the storage capacitor are electrically connected to the switching element. The pixels may be disposed in a matrix form.

The display panel 100 may include a first substrate, a second substrate facing the first substrate and a liquid crystal layer disposed between the first substrate and the second substrate. The gate lines, the data lines, pixel electrodes of the pixels and the switching elements may be formed on the first substrate. A common electrode may be formed on the second substrate.

Figure 2:
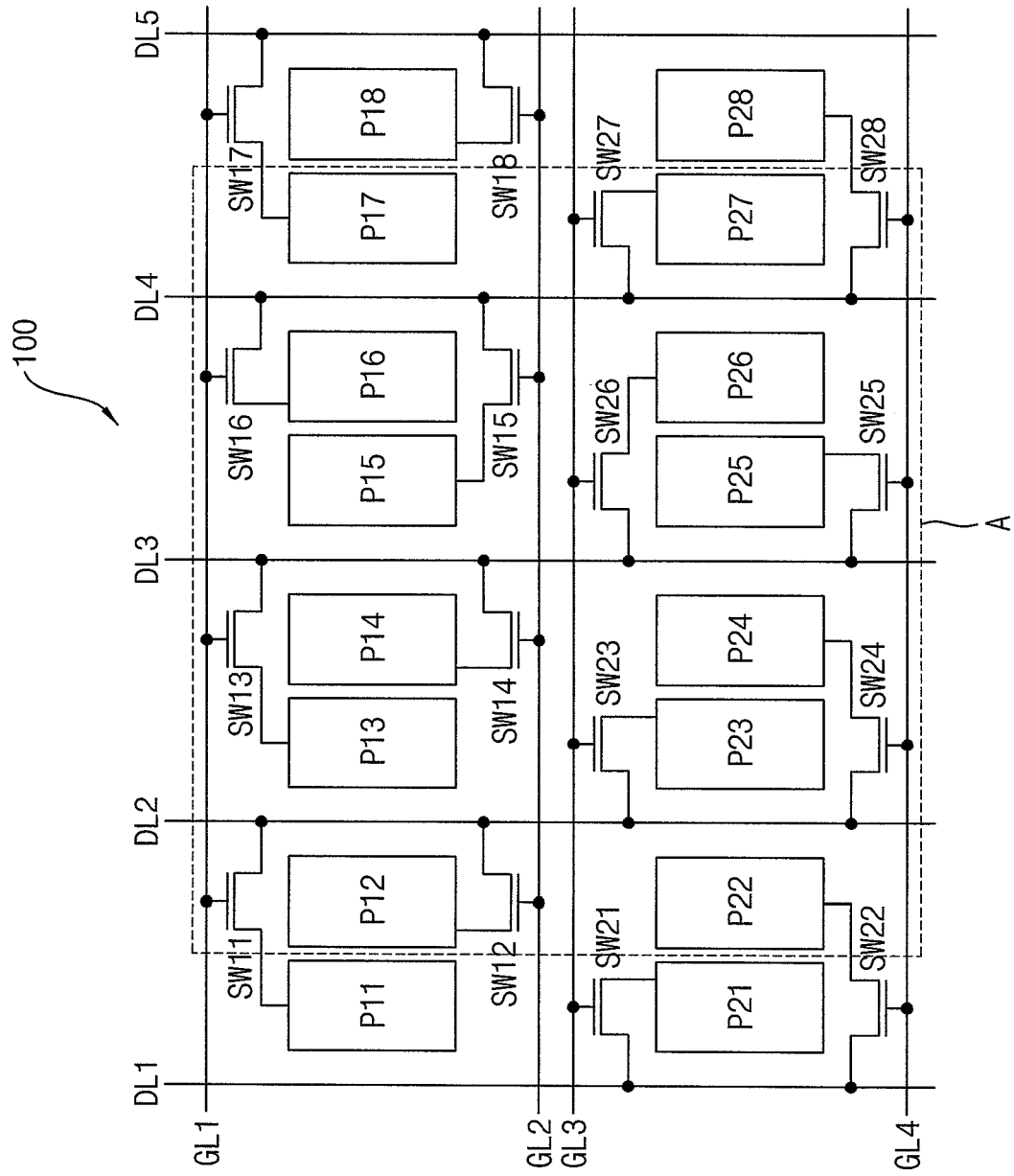
FIG. 2 is a conceptual diagram illustrating a pixel structure of a display panel of FIG. 1.

The structure of the display panel 100 may be explained referring to FIG. 2 in detail.

The timing controller 200 receives input image data IMG and an input control signal CONT from an external apparatus (not shown). The input image data may include red image data, green image data and blue image data. The input control signal CONT may include a master clock signal and a data enable signal. The input control signal CONT may further include a vertical synchronizing signal and a horizontal synchronizing signal.

The timing controller 200 generates a first control signal CONT1, a second control signal CONT2, a third control signal CONT3 and a data signal DATA based on the input image data IMG and the input control signal CONT.

The timing controller 200 generates the first control signal CONT1 for controlling an operation of the gate driver 300 based on the input control signal CONT, and outputs the first control signal CONT1 to the gate driver 300. The first control signal CONT1 may further include a vertical start signal and a gate clock signal.

The timing controller 200 generates the second control signal CONT2 for controlling an operation of the data driver 500 based on the input control signal CONT, and outputs the second control signal CONT2 to the data driver 500. The second control signal CONT2 may include a horizontal start signal and a load signal.

The timing controller 200 generates the data signal DATA based on the input image data IMG. The timing controller 200 outputs the data signal DATA to the data driver 500.

The timing controller 200 generates the third control signal CONT3 for controlling an operation of the gamma reference voltage generator 400 based on the input control signal CONT, and outputs the third control signal CONT3 to the gamma reference voltage generator 400.

The gate driver 300 generates gate signals driving the gate lines GL in response to the first control signal CONT1 received from the timing controller 200. The gate driver 300 may sequentially output the gate signals to the gate lines GL.

The gamma reference voltage generator 400 generates a gamma reference voltage VGREF in response to the third control signal CONT3 received from the timing controller 200. The gamma reference voltage generator 400 provides the gamma reference voltage VGREF to the data driver 500. The gamma reference voltage VGREF has a value corresponding to a level of the data signal DATA.

In an exemplary embodiment, the gamma reference voltage generator 400 may be disposed in the timing controller 200, or in the data driver 500.

The data driver 500 receives the second control signal CONT2 and the data signal DATA from the timing controller 200, and receives the gamma reference voltages VGREF from the gamma reference voltage generator 400. The data driver 500 converts the data signal DATA into data voltages having an analog type using the gamma reference voltages VGREF. The data driver 500 outputs the data voltages to the data lines DL.

FIG. 2 is a conceptual diagram illustrating a pixel structure of the display panel 100 of FIG. 1.

Referring to FIGS. 1 and 2, a single pixel row of the display panel 100 may be connected to two gate lines. For example, the pixels in a first pixel row may be selectively connected to a first gate line GL1 disposed in an upper portion of the first pixel row and a second gate line GL2 disposed in a lower portion of the first pixel row. In addition, the pixels in a second pixel row may be selectively connected to a third gate line GL3 disposed in an upper portion of the second pixel row and a fourth gate line GL4 disposed in a lower portion of the second pixel row.

Two adjacent pixel columns of the display panel 100 may be selectively connected to two adjacent data lines. For example, the pixels in first and second pixel columns may be connected to one of a first data line DL1 disposed in a left side of the first and second pixel columns and a second data line DL2 disposed in a right side of the first and second pixel columns. For example, a first pixel P11 in the first pixel column and a first pixel P12 in the second pixel column may be connected to the second data line DL2. A second pixel P21 in the first pixel column and a second pixel P22 in the second pixel column may be connected to the first data line DL1.

For convenience of explanation, sixteen pixels in two pixel rows and eight pixel columns are illustrated in FIG. 2. The display panel 100 includes a first pixel row including first to eight pixels P11 to P18 which are sequentially disposed and a second pixel row including nine to sixteen pixels P21 to P28 which are sequentially disposed.

The first pixel P11 is connected to the first gate line GL1 and the second data line DL2 through a first switching element SW11. The second pixel P12 is connected to the second gate line GL2 and the second data line DL2 through a second switching element SW12. The third pixel P13 is connected to the first gate line GL1 and a third data line DL3 through a third switching element SW13. The fourth pixel P14 is connected to the second gate line GL2 and the third data line DL3 through a fourth switching element SW14. The fifth pixel P15 is connected to the second gate line GL2 and a fourth data line DL4 through a fifth switching element SW15. The sixth pixel P16 is connected to the first gate line GL1 and the fourth data line DL4 through a sixth switching element SW16. The seventh pixel P17 is connected to the first gate line GL1 and a fifth data line DL5 through a seventh switching element SW17. The eighth pixel P18 is connected to the second gate line GL2 and the fifth data line DL5 through an eighth switching element SW18. The ninth pixel P21 is connected to the third gate line GL3 and the first data line DL1 through a ninth switching element SW21. The tenth pixel P22 is connected to the fourth gate line GL4 and the first data line DL1 through a tenth switching element SW22. The eleventh pixel P23 is connected to the third gate line GL3 and the second data line DL2 through an eleventh switching element SW23. The twelfth pixel P24 is connected to the fourth gate line GL4 and the second data line DL2 through a twelfth switching element SW24. The thirteenth pixel P25 is connected to the fourth gate line GL4 and the third data line DL3 through a thirteenth switching element SW25. The fourteenth pixel P26 is connected to the third gate line GL3 and the third data line DL3 through a fourteenth switching element SW26. The fifteenth pixel P27 is connected to the third gate line GL3 and the fourth data line DL4 through a fifteenth switching element SW27. The sixteenth pixel P28 is connected to the fourth gate line GL4 and fourth data line DL4 through a sixteenth switching element SW28.

The display panel 100 may include a pixel repeating group A including twelve pixels in two pixel rows and six pixel columns. The pixel repeating group A may include the second to seventh pixels P12 to P17 which are sequentially disposed in the first pixel row and the tenth to fifteenth pixels P22 to P27 which are sequentially disposed in the second pixel row.

In FIG. 2, the pixels P11 to P28 may be defined by pixel electrodes. The first to sixteenth pixels P11 to P28 may be defined by first to sixteenth pixel electrodes.

The area of A in FIG. 2 is an example of the pixel repeating group including twelve pixels in a two pixel row and a six pixel column. For convenience of explanation, the pixel structure of the display panel 100 is explained using the area of A in FIGS. 3 to 8.

Figure 3:
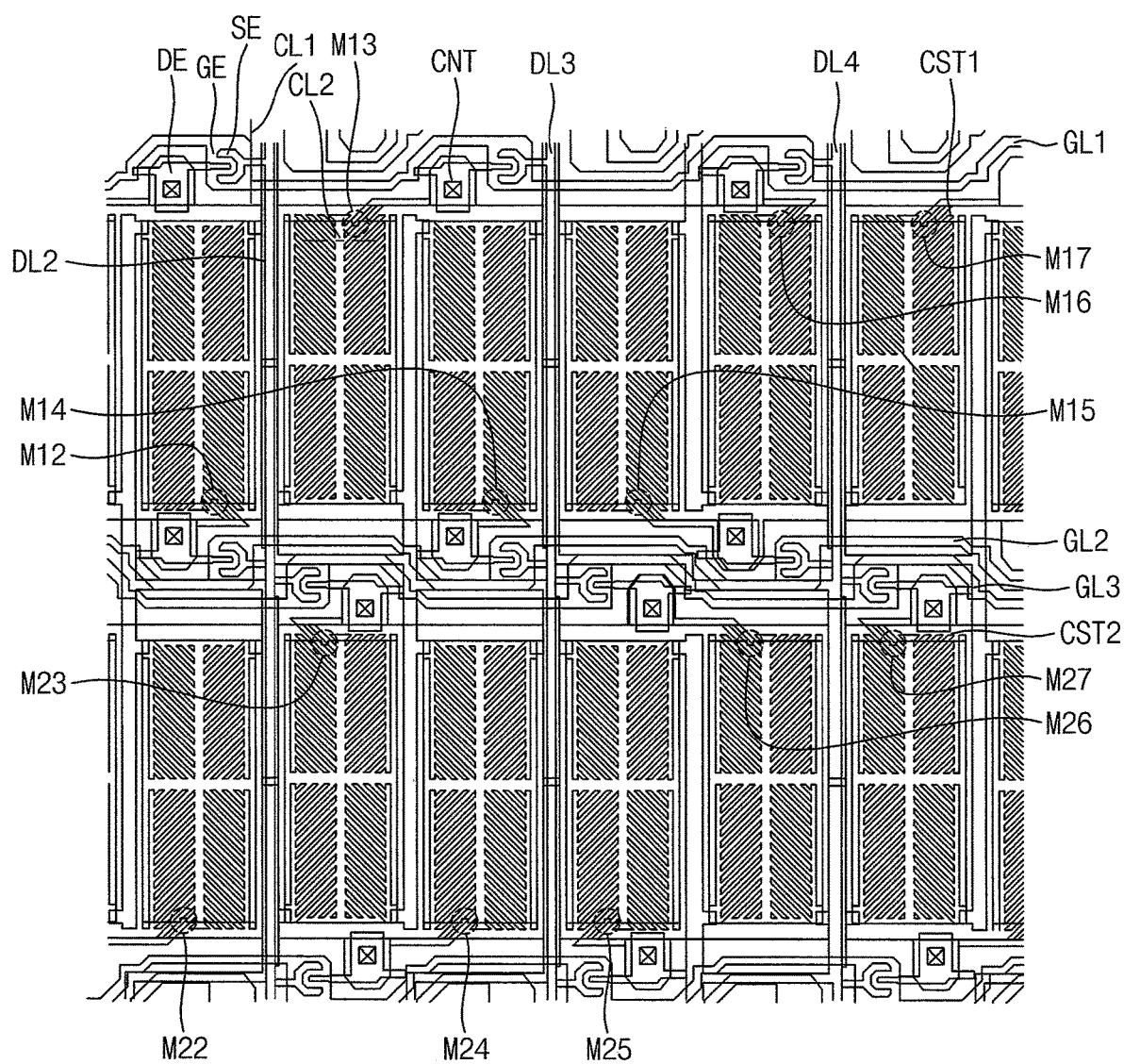
FIG. 3 is a plan view illustrating a pixel structure of an area A of FIG. 2.
Figure 4:
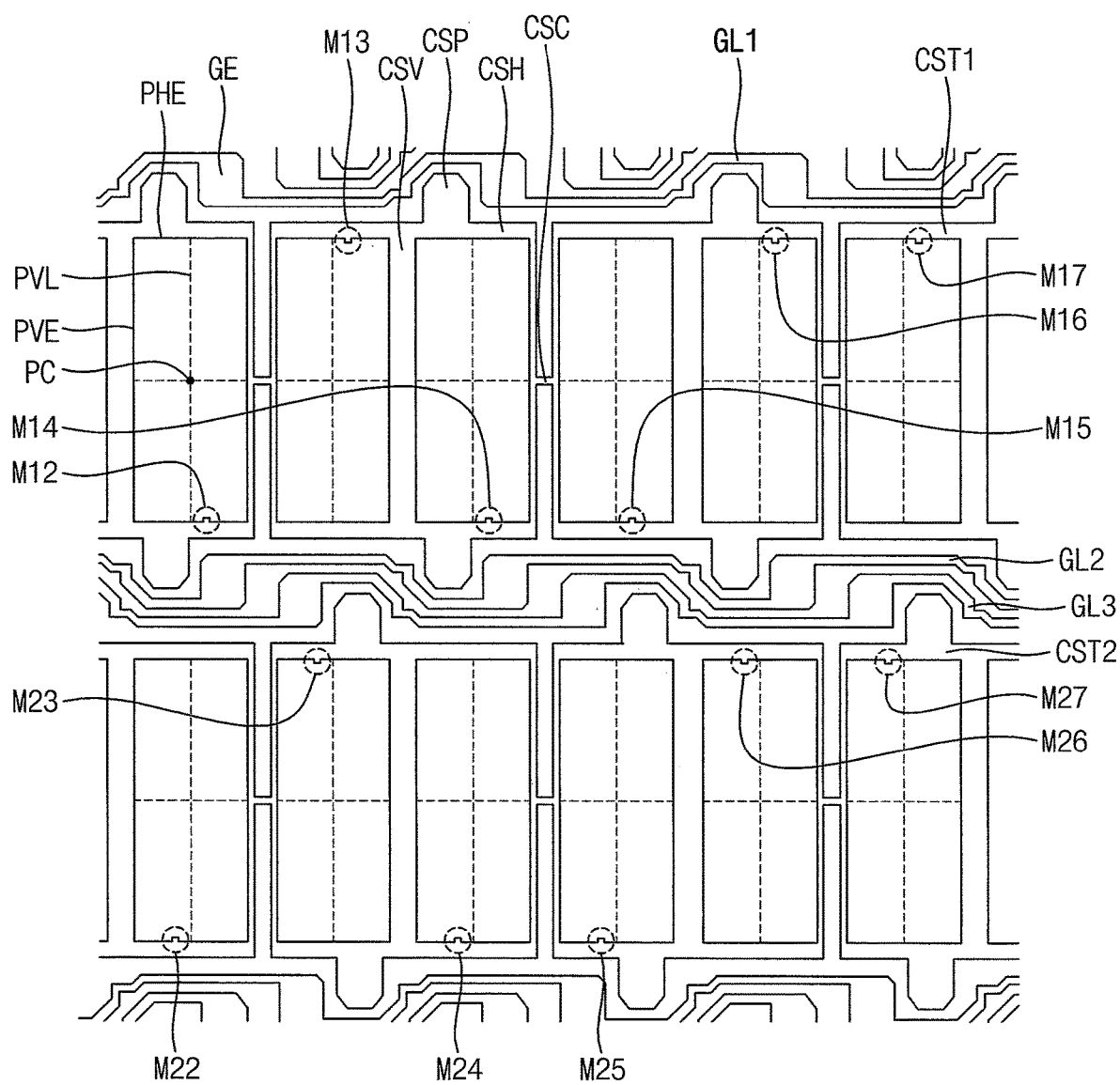
FIG. 4 is a plan view illustrating a gate layer of FIG. 3.
Figure 5:
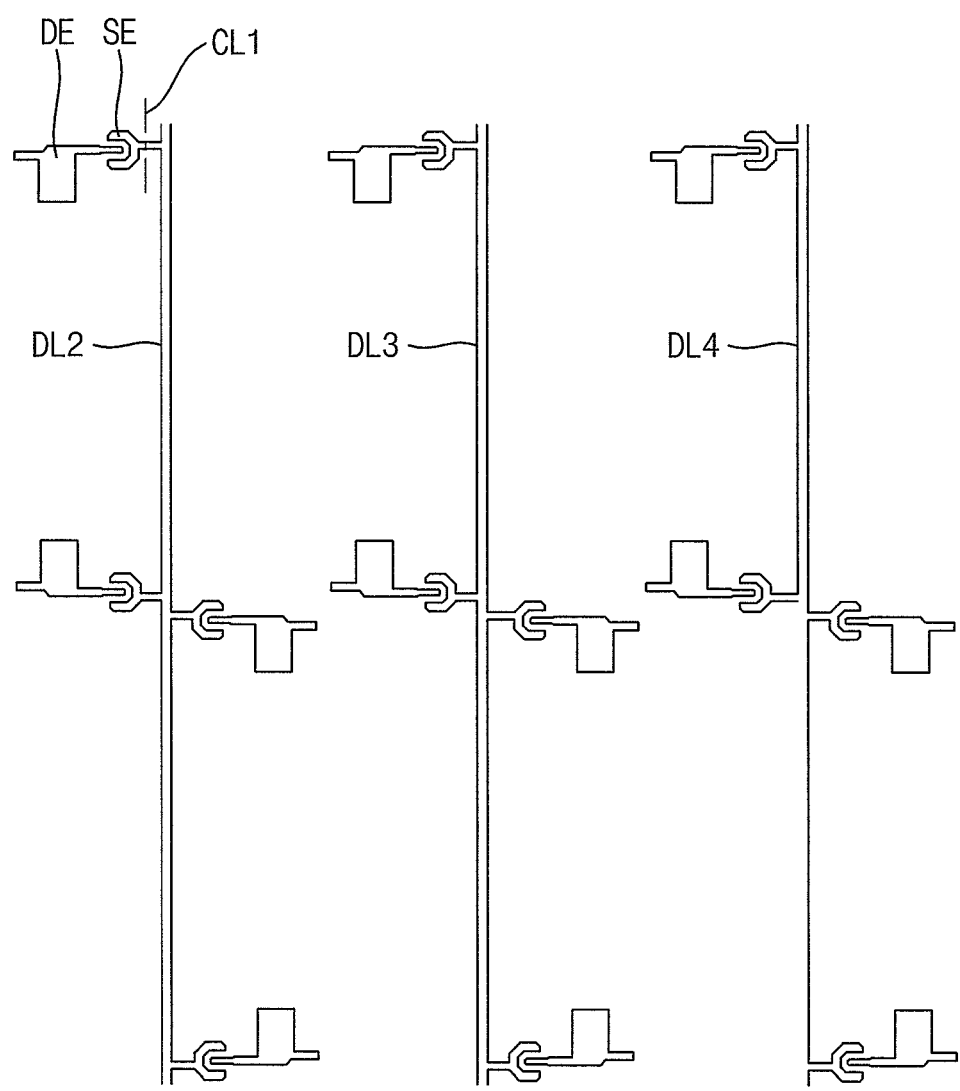
FIG. 5 is a plan view illustrating a data layer of FIG. 3.
Figure 6:
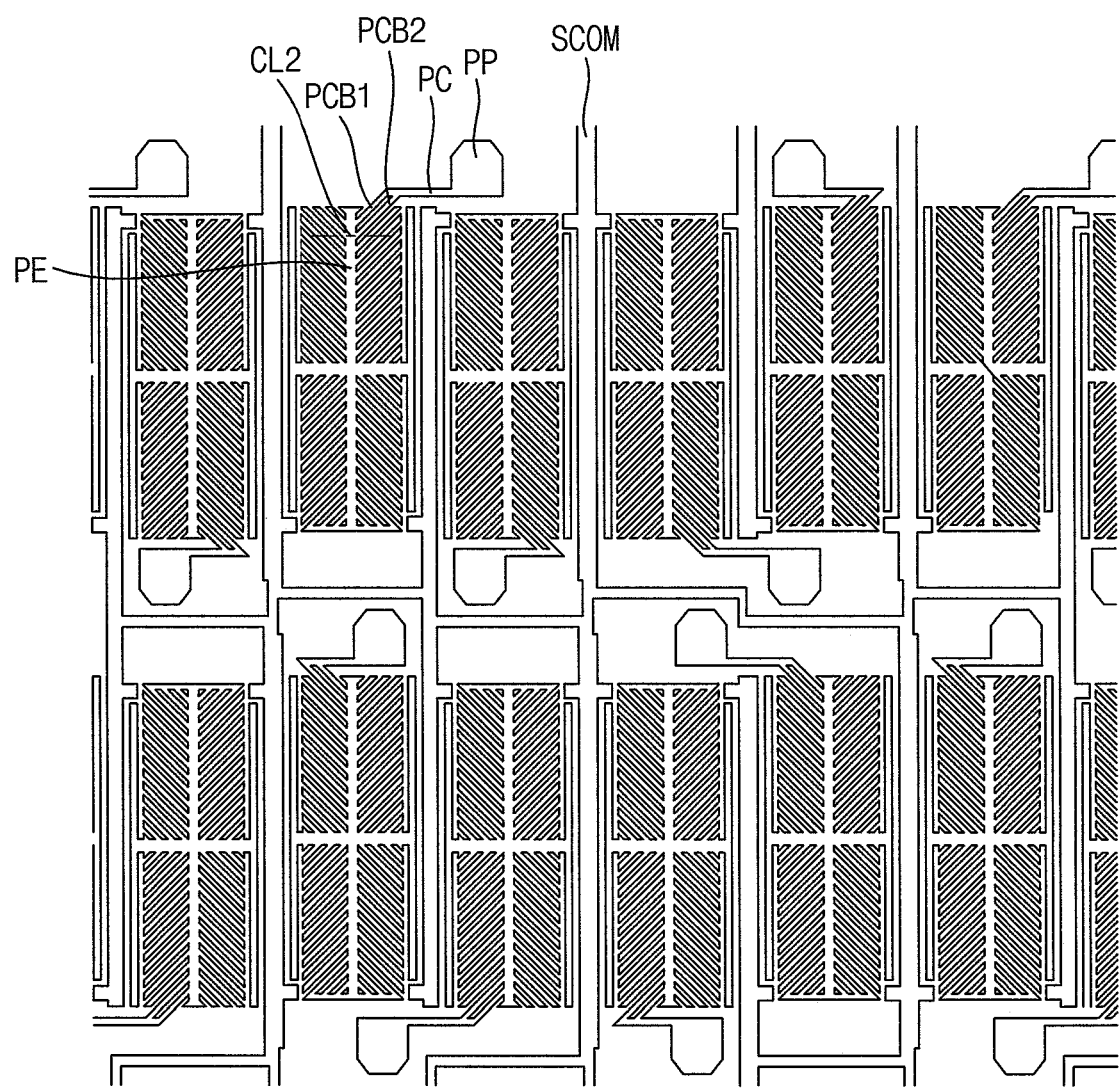
FIG. 6 is a plan view illustrating a pixel layer of FIG. 3.
Figure 7:
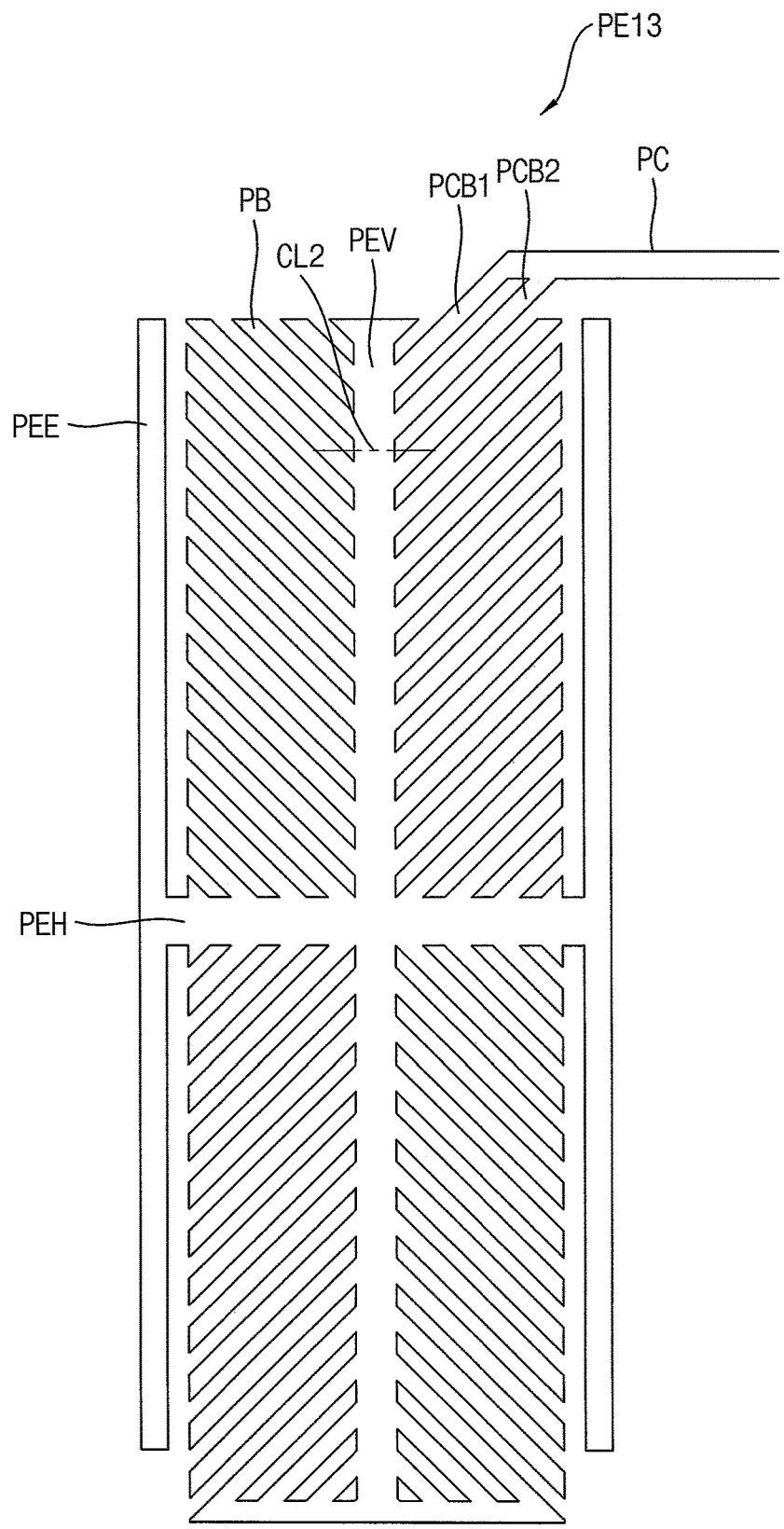
FIG. 7 is a detailed plan view illustrating a pixel electrode of FIG. 6.
Figure 8:
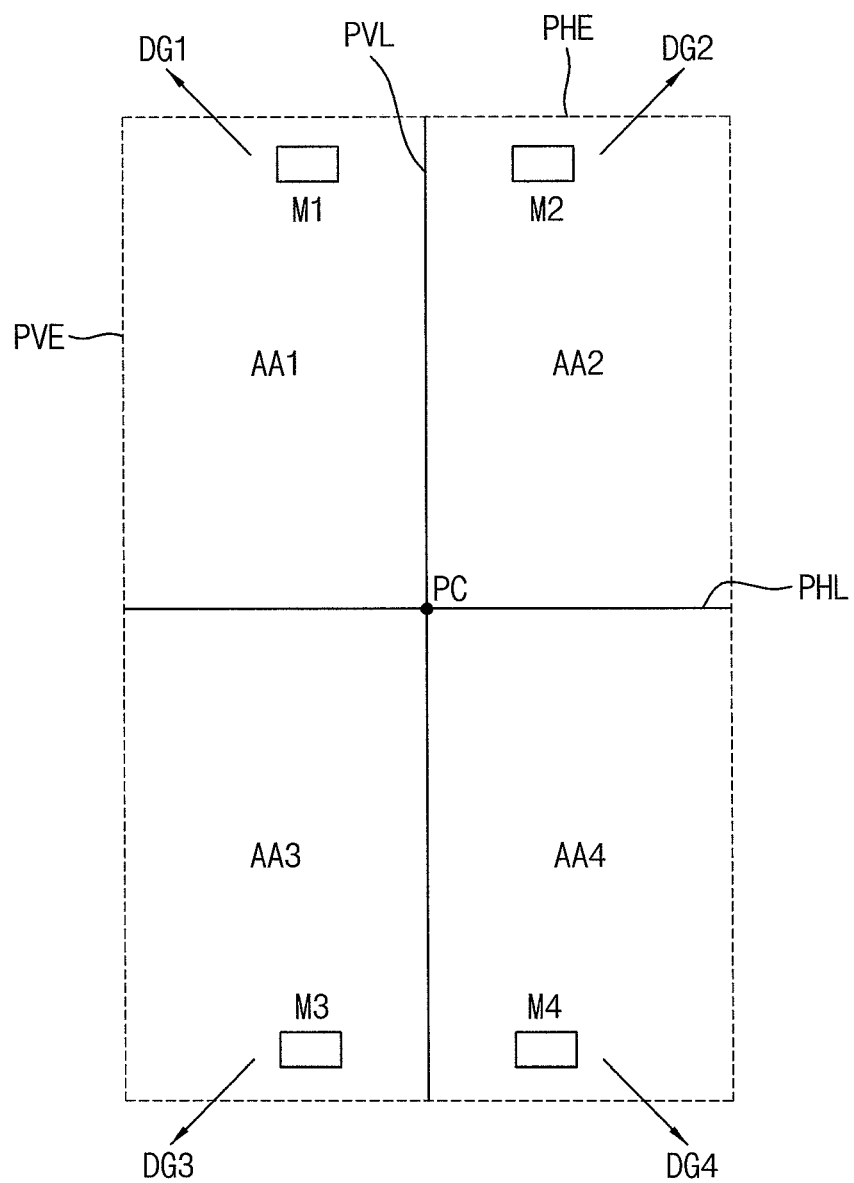
FIG. 8 is a conceptual diagram illustrating cutting positions according to positions of markers in the pixels of FIG. 3.

FIG. 3 is a plan view illustrating the pixel structure of the area A of FIG. 2. FIG. 4 is a plan view illustrating a gate layer of FIG. 3. FIG. 5 is a plan view illustrating a data layer of FIG. 3. FIG. 6 is a plan view illustrating a pixel layer of FIG. 3. FIG. 7 is a detailed plan view illustrating a pixel electrode of FIG. 6. FIG. 8 is a conceptual diagram illustrating cutting positions according to positions of markers in the pixels of FIG. 3.

Referring to FIGS. 1 to 8, the display panel 100 includes a gate layer, a data layer, a pixel layer and a marker.

The gate layer includes a gate pattern including a plurality of gate lines GL1, GL2 and GL3 and a plurality of gate electrodes GE connected to the gate lines GL1, GL2 and GL3 and a storage pattern spaced apart from the gate pattern.

The data layer includes a plurality of data lines DL1, DL2, DL3 and DL4, a plurality of source electrodes SE connected to the data lines DL1, DL2, DL3 and DL4 and a plurality of drain electrodes DE spaced apart from the source electrodes SE.

The pixel layer includes a plurality of pixel pad portions PP connected to the drain electrodes DE through a contact hole CNT, a plurality of pixel connecting portions PC extending from the pixel pad portions PP and a plurality of pixel electrodes PE connected to the pixel pad portions PP through the pixel connecting portions PC. The pixel layer may further include a storage common electrode SCOM spaced apart from the pixel electrode PE.

For example, the data layer may be formed on the gate layer. The pixel layer may be formed on the data layer. A first insulating layer may be disposed between the gate layer and the data layer. A second insulating layer may be disposed between the data layer and the pixel layer. The contact hole CNT may be formed through the second insulating layer.

Although the gate layer, the data layer and the pixel layer are sequentially disposed in the present exemplary embodiment, the present inventive concept is not limited thereto.

The sequence of the gate layer, the data layer and the pixel layer may be different from the above-mentioned sequence.

The markers M12 to M27 may have relatively different positions in the pixels according to the positions of the pixels P12 to P27. The pixels P12 to P27 may be defined by the pixel electrodes PE. A light blocking portion may be formed in a peripheral area of the pixel electrode PE. The area of the pixel electrode PE which is not covered by the light blocking portion may be defined as an opening portion. The pixel may be defined by the opening portion of the pixel electrode PE.

Referring to FIGS. 2 to 4, the gate electrodes GE are formed from the first gate line GL1 corresponding to upper portions of a first pixel electrode (P12 in FIG. 2), a third pixel electrode (P14 in FIG. 2), a fifth pixel electrode (P16 in FIG. 2) of the first pixel row.

The gate electrodes GE are formed from the second gate line GL2 corresponding to lower portions of the first pixel electrode (P12 in FIG. 2), the third pixel electrode (P14 in FIG. 2), the fifth pixel electrode (P16 in FIG. 2) of the first pixel row.

The storage pattern includes a first storage electrode CST1 corresponding to the first pixel row and a second storage electrode CST2 corresponding to the second pixel row.

The storage electrode CST1 and CST2 may include a first extending portion CSH extending in a horizontal direction D1 and a second extending portion CSV connected to the first extending portion CSH and extending in a vertical direction D2.

The storage electrode CST1 and CST2 may further include a protruding portion CSP protruded from the first extending portion CSH to the vertical direction D2. The protruding portion CSP may extend from the first extending portion CSH toward the outside of the pixel electrode. The protruding portion CSP may overlap the drain electrode DE and the pixel pad portion PP in a plan view.

The storage electrode CST1 and CST2 may further include a connecting portion CSC connecting the adjacent second extending portions CSV and overlapping the data line DL1, DL2, DL3 and DL4.

The storage electrode CST1 and CST2 of the gate layer and the storage common electrode SCOM may form the storage capacitor.

The marker M12 to M27 may be disposed in the storage pattern. The storage pattern may include the marker M12 to M27.

The marker M12 to M27 may be protruded from the first extending portion CSH of the storage electrode CST1 and CST2 to the vertical direction D2 and spaced apart from the second extending portion CSV. The marker M12 to M27 may be protruded from the first extending portion CSH toward an inside of the pixel electrode to overlap pixel electrode. The marker M12 to M27 represents a cutting position of the pixel to repair the pixel.

Referring to FIGS. 4 and 8, the marker M12 to M27 may be disposed one of a first area AA1, a second area AA2, a third area AA3 and a fourth area AA4. The first area AA1, the second area AA2, the third area AA3 and the fourth area AA4 are defined by a horizontal central line PHL of the pixel electrode and a vertical central line PVL of the pixel electrode. For example, the first pixel area AA1 may be an upper-left portion of a central point PC of the pixel electrode. For example, the second pixel area AA2 may be an upper-right portion of the central point PC of the pixel electrode. For example, the third pixel area AA3 may be a lower-left portion of the central point PC of the pixel electrode. For example, the fourth pixel area AA4 may be a lower-right portion of the central point PC of the pixel electrode.

The marker M12 to M27, illustrated in FIGS. 3 and 4, may be disposed closer to the vertical central line PVL of the pixel electrode than a vertical edge PVE of the pixel electrode. If the marker M12 to M27 is disposed closer to the vertical edge PVE of the pixel electrode, the marker M12 to M27 may be combined to a corner portion of a horizontal edge PHE of the pixel electrode and the vertical edge PVE of the pixel electrode in a photoresist step so that the marker M12 to M27 may not be shown.

For example, the marker M12 to M27 may have a rectangular shape. The size of the marker M12 to M27 before clean inspection may be preferably 5.0 um*3.0 um. The marker M12 to M27 may have a length of 5.0 um in the first direction D1 before clean inspection. The marker M12 to M27 may have a length of 3.0 um in the second direction D2 before clean inspection. The size of the marker M12 to M27 after clean inspection may be preferably 3.5 um*3.0 um. The marker M12 to M27 may have a length of 3.5 um in the first direction D1 after clean inspection. The marker M12 to M27 may have a length of 3.0 um in the second direction D2 after clean inspection. If the size of the marker M12 to M27 is too great, an aperture ratio of the display panel 100 may be decreased. If the size of the marker M12 to M27 is too small, the marker M12 to M27 may not be shown.

In FIG. 5, a source electrode SE is protruded from the second data line DL2 to the upper portion of the first pixel P12 in the first pixel row. Another source electrode SE is protruded from the second data line DL2 to the lower portion of the first pixel P12 in the first pixel row. Another source electrode SE is protruded from the second data line DL2 to the upper portion of the second pixel P23 in the second pixel row. Another source electrode SE is protruded from the second data line DL2 to the lower portion of the second pixel P23 in the second pixel row.

Similarly, a source electrode SE is protruded from the third data line DL3 to the upper portion of the second pixel P13 in the first pixel row. Another source electrode SE is protruded from the third data line DL3 to the lower portion of the second pixel P13 in the first pixel row. Another source electrode SE is protruded from the third data line DL3 to the upper portion of the third pixel P24 in the second pixel row. Another source electrode SE is protruded from the third data line DL3 to the lower portion of the third pixel P24 in the second pixel row.

A drain electrode DE is formed adjacent to the source electrode SE and spaced apart from the source electrode SE. The drain electrode DE overlaps the pixel pad portion PP and is connected to the pixel pad portion PP through the contact hole CNT. The drain electrode DE overlaps the gate electrode GE. The source electrode SE, the drain electrode DE and the gate electrode GE may form a switching element.

When the pixel does not normally display an image due to a fault of the manufacturing process of the switching element, the pixel electrode or a source/drain region, the pixel may be repaired. For example, to repair the pixel, the data voltage applied from the data line DL to the source electrode SE may be cut so that the data voltage may not be applied to the pixel electrode of the pixel. When the data voltage is not applied to the pixel electrode, the pixel displays a black image. The pixel displaying the black image may not be easily shown as compared to a pixel displaying a relatively bright image so that the pixel displaying the black image does not highly affect the display quality of the display panel.

As shown in FIG. 5, a first cutting line CL1 may be defined between the data line DL and the source electrode SE so that a connection between the data line DL and the source electrode SE may be cut to repair the pixel.

In FIGS. 6 and 7, the pixel electrode PE includes a first bar portion PEV extending in the vertical direction and overlapping the vertical central line, a second bar portion PEH extending in the horizontal direction and overlapping the horizontal central line and a connecting branch PCB1 and PCB2 connecting the first bar portion PEV and the pixel connecting portion PC. The pixel electrode PE may further include a plurality of branches extending in a diagonal direction from the first bar portion PEV.

For example, the first bar portion PEV and the pixel connecting portion PC may be connected by two connecting branches PCB1 and PCB2.

The pixel electrode PE may further include an edge portion PEE corresponding to a vertical edge of the pixel electrode PE and extending from the second bar portion PEH to the vertical direction.

When the pixel does not normally display an image due to the fault of the manufacturing process of the switching element, the pixel electrode or the source/drain region, the pixel may be repaired. For example, to repair the pixel, the data voltage applied to the pixel electrode SE may be cut. When the data voltage is not applied to the pixel electrode, the pixel displays a black image. The pixel displaying the black image may not be easily shown as compared to a pixel displaying a relatively bright image so that the pixel displaying the black image does not highly affect the display quality of the display panel.

As shown in FIG. 7, to cut the data voltage applied to the pixel electrode PE, a second cutting line CL2 may be defined on the first bar portion PEV adjacent to the connecting branches PCB1 and PCB2 so that the data voltage may not be applied to a majority area of the pixel electrode PE.

As shown in FIG. 6, the connecting branches PCB1 and PCB2 may be formed at one of an upper portion or a lower portion of the pixel electrode PE according to the pixels.

Referring to FIGS. 4 and 8, the marker M12 to M27 may be disposed one of the first area AA1, the second area AA2, the third area AA3 and the fourth area AA4. The first area AA1, the second area AA2, the third area AA3 and the fourth area AA4 are defined by a horizontal central line PHL of the pixel electrode and a vertical central line PVL of the pixel electrode. For example, the first pixel area AA1 may be an upper-left portion of a central point PC of the pixel electrode. For example, the second pixel area AA2 may be an upper-right portion of the central point PC of the pixel electrode. For example, the third pixel area AA3 may be a lower-left portion of the central point PC of the pixel electrode. For example, the fourth pixel area AA4 may be a lower-right portion of the central point PC of the pixel electrode. The marker may be disposed in a pixel area adjacent to the connecting branches PCB1 and PCB2.

When the marker M1 is formed in the first area AA1 in the pixel electrode, the first cutting line CL1 may be disposed between the closest source electrode and the closest data line from the central point PC of the pixel electrode in a first diagonal direction DG1 which is toward the first area AA1 from the central point PC.

For example, the closest source electrode may mean the source electrode of the switching element connected to the data line closest to the marker (e.g. M1 in FIG. 8) and the gate line closest to the marker (e.g. M1 in FIG. 8) and formed toward the central point PC of the pixel electrode.

When the marker M2 is formed in the second area AA2 in the pixel electrode, the first cutting line CL1 may be disposed between the closest source electrode and the closest data line from the central point PC of the pixel electrode in a second diagonal direction DG2 which is toward the second area AA2 from the central point PC.

When the marker M3 is formed in the third area AA3 in the pixel electrode, the first cutting line CL1 may be disposed between the closest source electrode and the closest data line from the central point PC of the pixel electrode in a third diagonal direction DG3 which is toward the third area AA3 from the central point PC.

When the marker M4 is formed in the fourth area AA4 in the pixel electrode, the first cutting line CL1 may be disposed between the closest source electrode and the closest data line from the central point PC of the pixel electrode in a fourth diagonal direction DG4 which is toward the fourth area AA4 from the central point PC.

Referring again to FIGS. 2 and 3, the pixel repeating group includes the second to seventh pixels P12 to P17 in the first pixel row in FIG. 2 and the tenth to fifteenth pixels P22 to P27 in the second pixel row in FIG. 2.

The first pixel P11 is connected to the first gate line GL1 and the second data line DL2 through the first switching element SW11. The second pixel P12 is connected to the second gate line GL2 and the second data line DL2 through the second switching element SW12. The third pixel P13 is connected to the first gate line GL1 and a third data line DL3 through the third switching element SW13. The fourth pixel P14 is connected to the second gate line GL2 and the third data line DL3 through the fourth switching element SW14. The fifth pixel P15 is connected to the second gate line GL2 and a fourth data line DL4 through the fifth switching element SW15. The sixth pixel P16 is connected to the first gate line GL1 and the fourth data line DL4 through the sixth switching element SW16. The seventh pixel P17 is connected to the first gate line GL1 and a fifth data line DL5 through the seventh switching element SW17. The eighth pixel P18 is connected to the second gate line GL2 and the fifth data line DL5 through then eighth switching element SW18. The ninth pixel P21 is connected to the third gate line GL3 and the first data line DL1 through the ninth switching element SW21. The tenth pixel P22 is connected to the fourth gate line GL4 and the first data line DL1 through the tenth switching element SW22. The eleventh pixel P23 is connected to the third gate line GL3 and the second data line DL2 through then eleventh switching element SW23. The twelfth pixel P24 is connected to the fourth gate line GL4 and the second data line DL2 through the twelfth switching element SW24. The thirteenth pixel P25 is connected to the fourth gate line GL4 and the third data line DL3 through the thirteenth switching element SW25. The fourteenth pixel P26 is connected to the third gate line GL3 and the third data line DL3 through the fourteenth switching element SW26. The fifteenth pixel P27 is connected to the third gate line GL3 and the fourth data line DL4 through the fifteenth switching element SW27. The sixteenth pixel P28 is connected to the fourth gate line GL4 and fourth data line DL4 through the sixteenth switching element SW28. A second marker M12 in the second pixel P12 may be formed in the fourth area AA4 (M4 in FIG. 8). A third marker M13 in the third pixel P13 may be formed in the second area AA2 (M2 in FIG. 8). A fourth marker M14 in the fourth pixel P14 may be formed in the fourth area AA4 (M4 in FIG. 8). A fifth marker M15 in the fifth pixel P15 may be formed in the fourth area AA4 (M4 in FIG. 8). A sixth marker M16 in the sixth pixel P16 may be formed in the second area AA2 (M2 in FIG. 8). A seventh marker M17 in the seventh pixel P17 may be formed in the second area AA2 (M2 in FIG. 8). A tenth marker M22 in the tenth pixel P22 may be formed in the third area AA3 (M3 in FIG. 8). An eleventh marker M23 in the eleventh pixel P23 may be formed in the first area AA1 (M1 in FIG. 8). A twelfth marker M24 in the twelfth pixel P24 may be formed in the third area AA3 (M3 in FIG. 8). A thirteenth marker M25 in the thirteenth pixel P25 may be formed in the third area AA3 (M3 in FIG. 8). A fourteenth marker M26 in the fourteenth pixel P26 may be formed in the first area AA1 (M1 in FIG. 8). A fifteenth marker M27 in the fifteenth pixel P27 may be formed in the first area AA1 (M1 in FIG. 8).

As shown in FIG. 8, the marker M12 to M27 may be selectively formed in the first area AA1, the second area AA2, the third area AA3 and the fourth area AA4 which are divided by the horizontal central line PHL of the pixel electrode and the vertical central line PVL of the pixel electrode.

When the marker (e.g. M13, M16, M17, M23, M26 and M27) is formed at an upper side (M1 and M2 in FIG. 8) with respect to the horizontal central line PHL of the pixel electrode, the connecting branch PCB1 and PCB2 of the pixel electrode may be disposed at the upper portion of the pixel electrode and the second cutting line CL2 may be disposed on the first bar portion PEV right below the connecting branch PCB1 and PCB2 to cut the first bar portion PEV.

When the marker (e.g. M12, M14, M15, M22, M24 and M25) is formed at a lower side (M3 and M4 in FIG. 8) with respect to the horizontal central line PHL of the pixel electrode, the connecting branch PCB1 and PCB2 of the pixel electrode may be disposed at the lower portion of the pixel electrode and the second cutting line CL2 may be disposed on the first bar portion PEV right above the connecting branch PCB1 and PCB2 to cut the first bar portion PEV.

According to the present exemplary embodiment, the display panel 100 includes the markers having relatively different positions in the pixels to easily repair the defective pixel although the pixel structure of the display panel 100 is complex. Thus, the productivity of the display panel 100 may increase. The manufacturing cost of the display panel 100 may be reduced.

Figure 9:
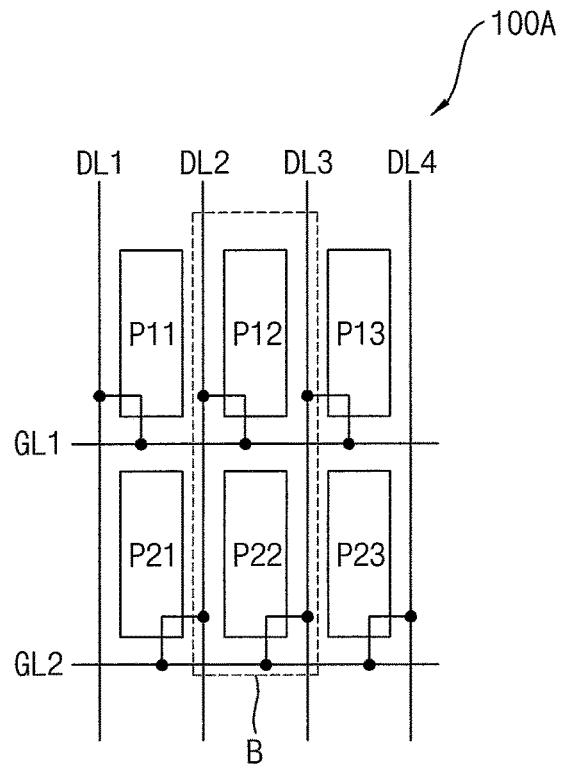
FIG. 9 is a conceptual diagram illustrating a pixel structure of a display panel according to an exemplary embodiment of the present inventive concept.
Figure 10:
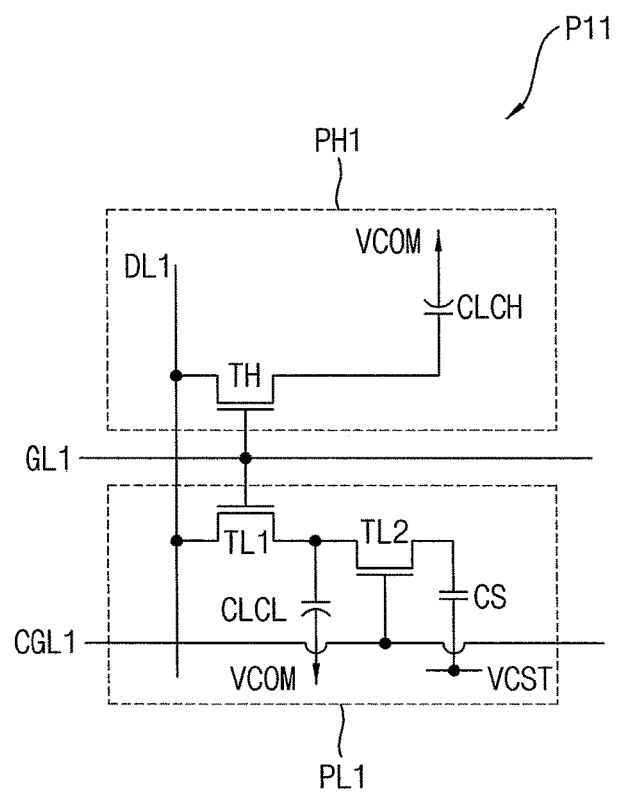
FIG. 10 is a circuit diagram illustrating a first pixel of FIG. 9.

FIG. 9 is a conceptual diagram illustrating a pixel structure of a display panel according to an exemplary embodiment of the present inventive concept. FIG. 10 is a circuit diagram illustrating a first pixel of FIG. 9.

The display panel and the method of repairing the display panel according to the present exemplary embodiment is substantially the same as the display panel and the method of repairing the display panel of the previous exemplary embodiment explained referring to FIGS. 1 to 8 except for the pixel structure of the display panel and the position of the marker. Thus, the same reference numerals will be used to refer to the same or like parts as those described in the previous exemplary embodiment of FIGS. 1 to 8 and any repetitive explanation concerning the above elements will be omitted.

Referring to FIGS. 1, 9 and 10, the display apparatus includes a display panel 100A and a display panel driver. The display panel driver includes a timing controller 200, a gate driver 300, a gamma reference voltage generator 400 and a data driver 500.

Each pixel of the display panel 100A may include a switching element, a liquid crystal capacitor and a storage capacitor. The liquid crystal capacitor and the storage capacitor are electrically connected to the switching element. The pixels may be disposed in a matrix form.

The display panel 100A may include a first substrate, a second substrate facing the first substrate and a liquid crystal layer disposed between the first substrate and the second substrate. The gate lines, the data lines, pixel electrodes of the pixels and the switching elements may be formed on the first substrate. A common electrode may be formed on the second substrate.

Referring to FIGS. 1 and 9, a single pixel row of the display panel 100A may be connected to a single gate line. For example, the pixels in a first pixel row may be connected to a first gate line GL1 disposed in a lower portion of the first pixel row. In addition, the pixels in a second pixel row may be connected to a second gate line GL2 disposed in a lower portion of the second pixel row.

A single pixel column of the display panel 100A may be alternately connected to two adjacent data lines. For example, the pixels in the first pixel column may be alternately connected to a first data line DL1 disposed in a left side of the first pixel column and a second data line DL2 disposed in a right side of the first pixel column. For example, the pixels in the second pixel column may be alternately connected to the second data line DL2 disposed in a left side of the second pixel column and a third data line DL3 disposed in a right side of the second pixel column.

The display panel 100A includes first to third pixels P11 to P13 disposed in the first pixel row and fourth to sixth pixels P21 to P23 disposed in the second pixel row.

The first pixel P11 is connected to the first gate line GL1 and the first data line DL1. The second pixel P12 is connected to the first gate line GL1 and the second data line DL2. The third pixel P13 is connected to the first gate line GL1 and the third data line DL3. The fourth pixel P21 is connected to the second gate line GL2 and the second data line DL2. The fifth pixel P22 is connected to the second gate line GL2 and the third data line DL3. The sixth pixel P23 is connected to the second gate line GL2 and a fourth data line DL4.

An area of B in FIG. 9 includes pixels disposed in two pixel rows and a pixel column. Two pixels in the area of B are repeated in the display panel 100A.

In an exemplary embodiment, the pixel may include a high pixel and a low pixel. For example, the first pixel P11 includes the high pixel PH1 and the low pixel PL1.

The high pixel PH1 includes a first switching element TH and a first liquid crystal capacitance CLCH connected to the first switching element TH.

The low pixel PL1 includes a second switching element TL1, a second liquid crystal capacitance CLCL connected to the second switching element TL1, a third switching element TL2 connected to the second switching element TL1 in series and a charge sharing capacitance CS connected to the third switching element TL2.

The first switching element TH may include a gate electrode connected to the first gate line GL1, a source electrode connected to the first data line DL1 and a drain electrode forming a first electrode of the first liquid crystal capacitance CLCH. A second electrode of the first liquid crystal capacitance CLCH may be a common electrode.

The second switching element TL1 may include a gate electrode connected to the first gate line GL1, a source electrode connected to the first data line DL1 and a drain electrode forming a first electrode of the second liquid crystal capacitance CLCL. A second electrode of the second liquid crystal capacitance CLCL may be a common electrode.

The third switching element TL2 may include a gate electrode connected to a first charge sharing gate line CGL1, a source electrode connected to the drain electrode of the second switching element TL1 and a drain electrode forming a first electrode of the charge sharing capacitance CS. A second electrode of the charge sharing capacitance CS may be a charge sharing electrode formed in the data layer.

In the present exemplary embodiment, when the gate signal is applied to the first switching element TH through the gate line, the first switching element TH is turned on so that the data voltage is applied to the first liquid crystal capacitance CLCH of the high pixel through the data line. When the gate signal is applied to the second switching element TL1 through the gate line, the second switching element TL1 is also turned on so that the data voltage is applied to the second liquid crystal capacitance CLCL of the low pixel through the data line.

When the charge gate signal is applied to the third switching element TL2 through the charge sharing gate line CGL1, the voltage level of the second liquid crystal capacitance CLCL is reduced so that the low pixel has a pixel voltage less than the pixel voltage of the high pixel.

Figure 11:
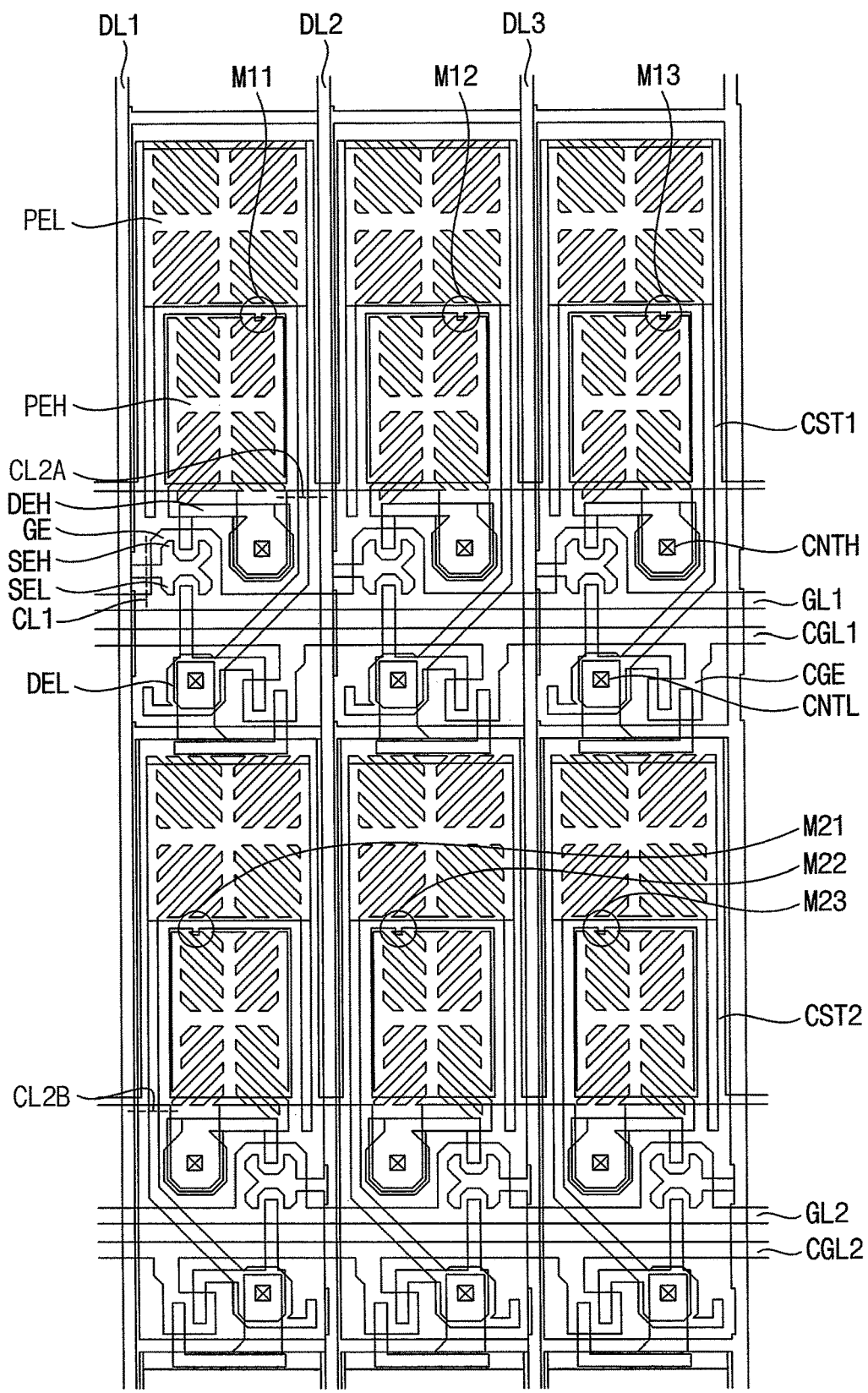
FIG. 11 is a plan view illustrating a pixel structure of FIG. 9.
Figure 12:
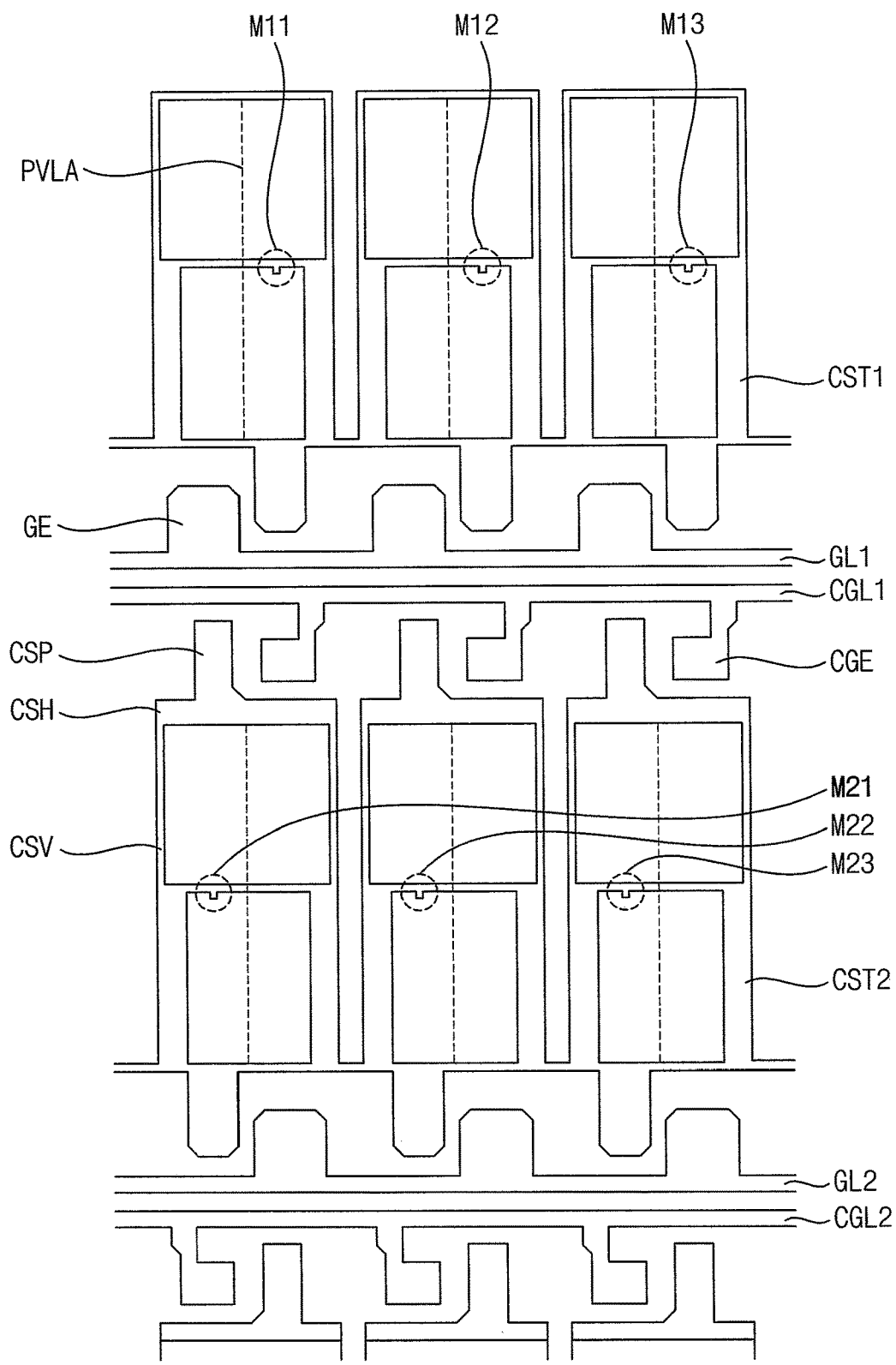
FIG. 12 is a plan view illustrating a gate layer of FIG. 11.
Figure 13:
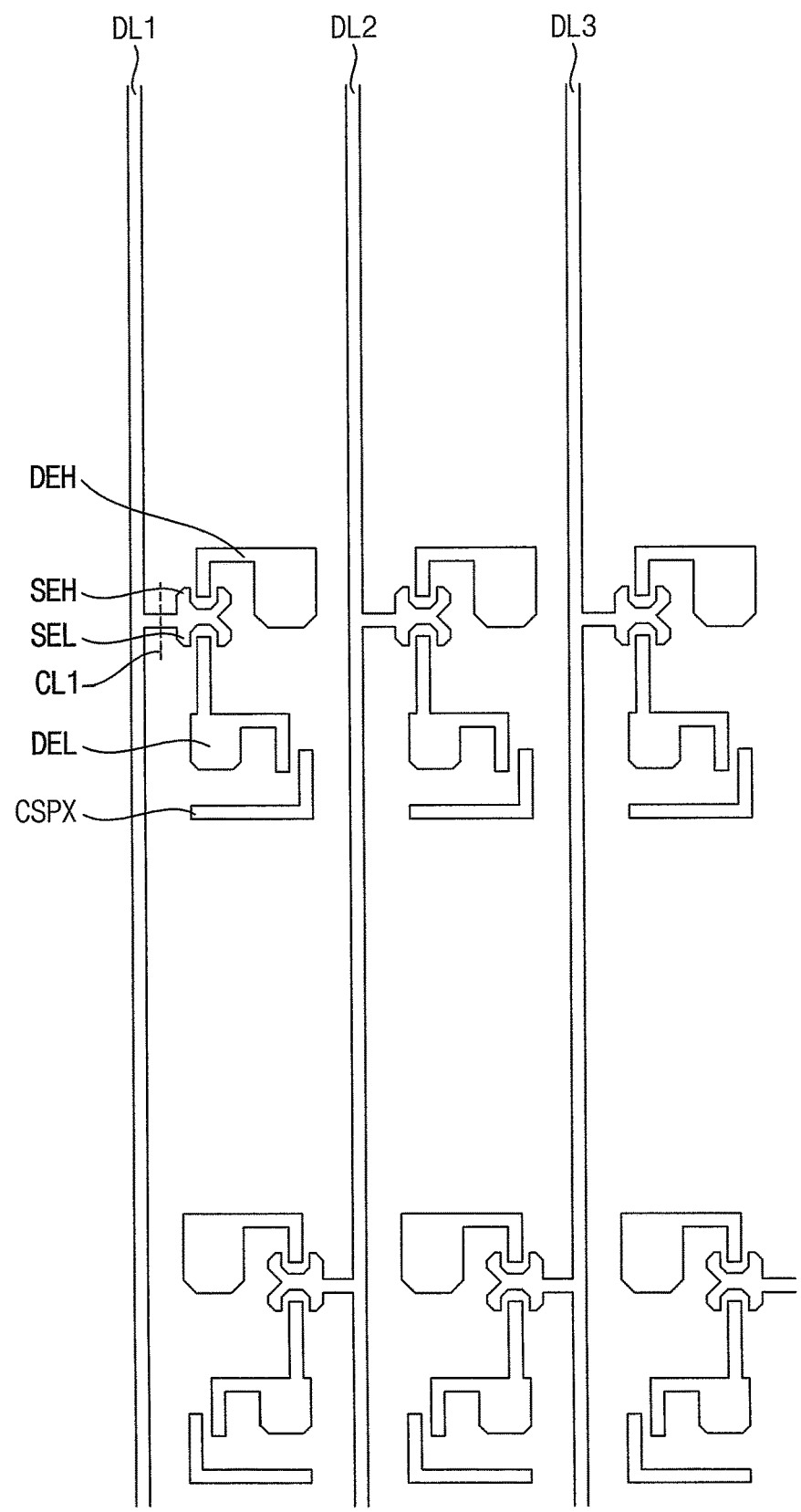
FIG. 13 is a plan view illustrating a data layer of FIG. 11.
Figure 14:
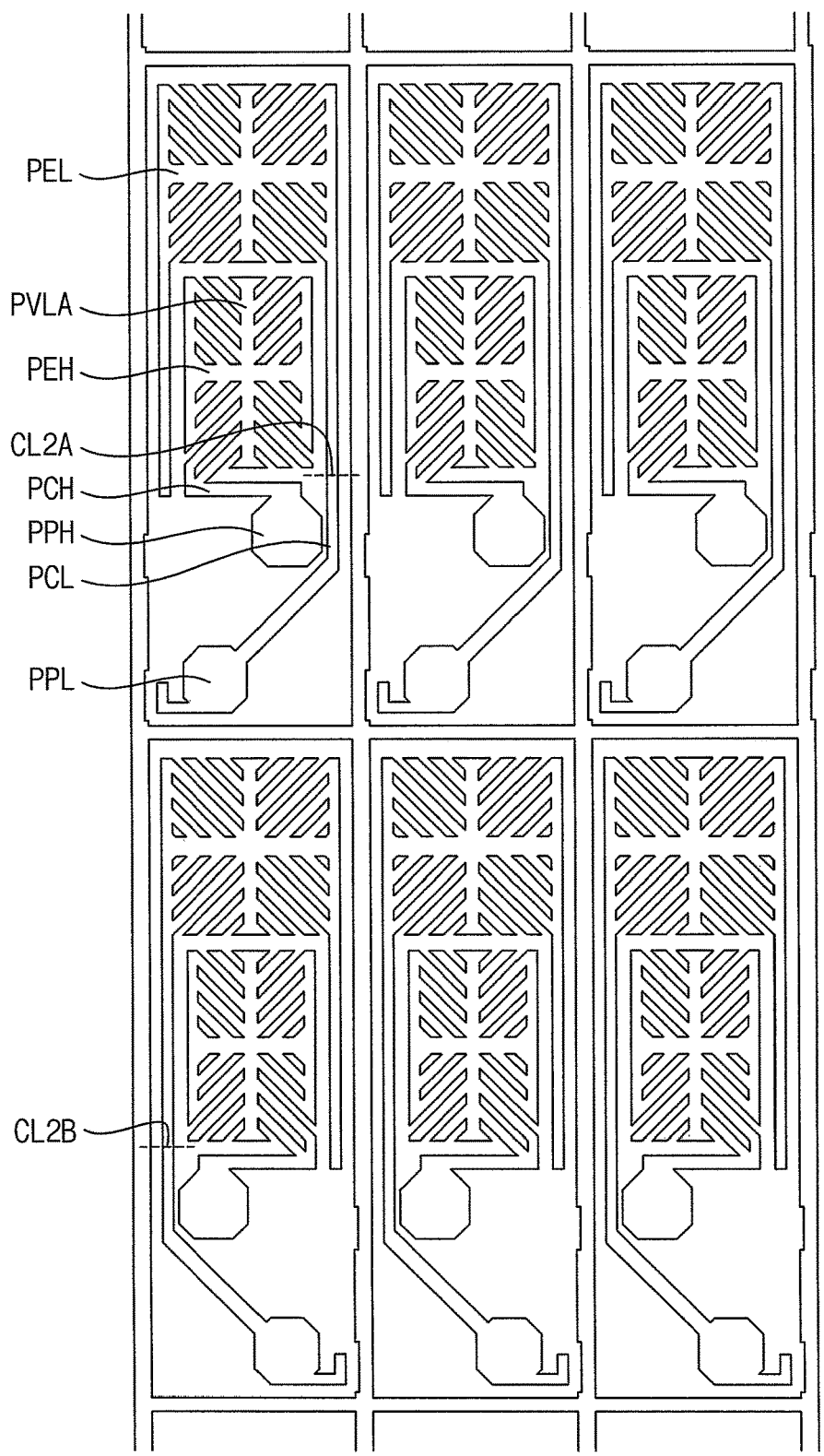
FIG. 14 is a plan view illustrating a pixel layer of FIG. 11.

FIG. 11 is a plan view illustrating a pixel structure of the display panel 100A of FIG. 9. FIG. 12 is a plan view illustrating a gate layer of FIG. 11. FIG. 13 is a plan view illustrating a data layer of FIG. 11. FIG. 14 is a plan view illustrating a pixel layer of FIG. 11.

Referring to FIGS. 9 to 14, the display panel 100A includes a gate layer, a data layer, a pixel layer and a marker.

The gate layer includes a gate pattern including a plurality of gate lines GL1 and GL2 and a plurality of gate electrodes GE connected to the gate lines GL1 and GL2 and a storage pattern spaced apart from the gate pattern.

In the present exemplary embodiment, the gate layer may further include a charge sharing gate pattern including a plurality of charge sharing gate lines CGL1 and CGL2 and a plurality of charge sharing gate electrode CGE connected to the charge sharing gate lines CGL1 and CGL2.

The data layer includes a plurality of data lines DL1, DL2 and DL3, a plurality of source electrodes SEL and SEH connected to the data lines DL1, DL2 and DL3 and a plurality of drain electrodes DEH and DEL spaced apart from the source electrodes SEL and SHE, respectively.

In the present exemplary embodiment, the data layer may further include a charge sharing electrode CSPX.

The pixel layer includes a plurality of pixel pad portions PPH and PPL connected to the drain electrodes DEH and DEL through a contact hole CNT, a plurality of pixel connecting portions PCH and PCL extending from the pixel pad portions PPH and PPL and a plurality of pixel electrodes PEH and PEL connected to the pixel pad portions PPH and PPL through the pixel connecting portions PCH and PCL.

The markers M11 to M23 may have relatively different positions in the pixels according to the positions of the pixels P11 to P23. The pixels P11 to P23 may be defined by the pixel electrodes PEH and PEL.

Referring to FIG. 11, the gate electrodes GE are formed from the first gate line GL1 corresponding to lower portions of a first pixel electrode P11, a second pixel electrode P12, a third pixel electrode P13 of the first pixel row. In the present exemplary embodiment, the gate electrode GE may overlap the source electrode SEH of the first switching element TH and the source electrode SEL of the second switching element TL1.

The first charge sharing gate line CGL1 may extend in a direction parallel to the first gate line GL1. The charge sharing gate electrode CGE may be protruded from the first charge sharing gate line CGL1 in a vertical direction.

In the first pixel row, the gate electrode GE is disposed in a left side with respect to the charge sharing gate electrode CGE. In contrast, in the second pixel row, the gate electrode GE is disposed in a right side with respect to the charge sharing gate electrode CGE.

The storage pattern includes a first storage electrode CST1 corresponding to the first pixel row and a second storage electrode CST2 corresponding to the second pixel row.

The storage electrode CST1 and CST2 may include a first extending portion CSH extending in a horizontal direction and a second extending portion CSV connected to the first extending portion CSH and extending in a vertical direction.

The storage electrode CST1 and CST2 may further include a protruding portion CSP protruded from the first extending portion CSH to the vertical direction D2. The protruding portion CSP may extend from the first extending portion CSH toward the outside of the pixel electrode. The protruding portion CSP may overlap the drain electrode DEH and DEL and the pixel pad portion PPH and PPL in a plan view.

The marker M11 to M23 may be disposed in the storage pattern. The storage pattern may include the marker M11 to M23.

The marker M11 to M23 may be protruded from the first extending portion CSH of the storage electrode CST1 and CST2 to the vertical direction and spaced apart from the second extending portion CSV. The marker M11 to M23 may be protruded from the first extending portion CSH toward the inside of the pixel electrode. For example, the marker M11 to M23 may be protruded from the first extending portion CSH toward the inside of the pixel electrode of the high pixel.

The marker M11 to M23 may be disposed one of a first area and a second area. The first area and the second area are divided by a vertical central line PVLA of the pixel electrode.

In FIG. 13, a source electrode SEH and SEL is protruded from the first data line DL1 to the lower portion of the first pixel electrode P11 in the first pixel row.

The source electrode may include a high pixel source electrode SEH and a low pixel source electrode SEL. For example, the high pixel source electrode SEH and the low pixel source electrode SEL may be connected to each other so that the high pixel source electrode SEH and the low pixel source electrode SEL may be integratedly formed.

A high pixel drain electrode DEH is formed adjacent to the high pixel source electrode SEH and spaced apart from the high pixel source electrode SEH. The high pixel drain electrode DEH overlaps the high pixel pad portion PPH and is connected to the high pixel pad portion PPH through the contact hole CNTH. The high pixel drain electrode DEH overlaps the gate electrode GE. The high pixel source electrode SEH, the high pixel drain electrode DEH and the gate electrode GE may form the first switching element TH.

A low pixel drain electrode DEL is formed adjacent to the low pixel source electrode SEL and spaced apart from the low pixel source electrode SEL. The low pixel drain electrode DEL overlaps the low pixel pad portion PPL and is connected to the low pixel pad portion PPL through the contact hole CNTL. The low pixel drain electrode DEL overlaps the gate electrode GE. The low pixel source electrode SEL, the low pixel drain electrode DEL and the gate electrode GE may form the second switching element TL1.

The charge sharing electrode CSPX is formed adjacent to the low pixel drain electrode DEL and spaced apart from the low pixel drain electrode DEL. An extending portion of the low pixel drain electrode DEL, the charge sharing electrode CSPX and the charge sharing gate electrode CGE may form the third switching element TL2.

When the pixel does not normally display an image due to a fault of the manufacturing process of the switching elements, the pixel electrode or a source/drain region, the pixel may be repaired. For example, to repair the pixel, the data voltage applied from the data line DL to the source electrodes SEH and SEL may be cut so that the data voltage may not be applied to the pixel electrode of the pixel. When the data voltage is not applied to the pixel electrode, the p displays a black image. The pixel displaying the black image may not be easily shown as compared to a pixel displaying a relatively bright image so that the pixel displaying the black image does not highly affect the display quality of the display panel.

As shown in FIG. 13, a first cutting line CL1 may be disposed between the data line DL and the source electrodes SEH and SEL so that a connection between the data line DL and the source electrodes SEH and SEL may be cut to repair the pixel.

In the present exemplary embodiment, the position of the first cutting line CL1 is relatively easy to determine so that the marker may not indicate the position of the first cutting line CL1.

In FIG. 14, the pixel electrode includes the low pixel electrode PEL disposed at an upper portion of the pixel and the high pixel electrode PEH disposed at a lower portion of the pixel.

The pixel pad portions may include the low pixel pad portion PPL to apply the data voltage to the low pixel electrode PEL and the high pixel pad portion PPH to apply the data voltage to the high pixel electrode PEH.

The pixel connecting portions may include a low pixel connecting portion PCL connecting the low pixel electrode PEL and the low pixel pad portion PPL and a high pixel connecting portion PCH connecting the high pixel electrode PEH and the high pixel pad portion PPH.

The low pixel connecting portion PCL may be disposed at one of the left side with respect to the high pixel electrode and the right side with respect to the high pixel electrode according to the pixels. For example, the low pixel connecting portions PCL is disposed at the right side of the high pixel electrode in the pixels P11, P12 and P13 of the first pixel row. For example, the low pixel connecting portions PCL is disposed at the left side of the high pixel electrode in the pixels P21, P22 and P23 of the second pixel row.

The low pixel electrode includes a first edge extending portion extending along a left edge of the high pixel electrode and a second edge extending portion extending along a right edge of the high pixel. When a light blocking portion is formed in the display panel 100A, it is difficult to determine whether the low pixel connecting portion PCL is connected to the first edge extending portion or the second edge extending portion.

In the present exemplary embodiment, the marker M11 to M23 may be disposed one of the first area and the second area. The first area and the second area are divided by the vertical central line PVLA of the pixel electrode.

When the first area is the left side of the vertical central line PVLA and the marker is formed in the first area (e.g. M21, M22 and M23 in FIG. 12), a portion of the low pixel electrode at the left side of the high pixel electrode may be cut by a second cutting line CL2B.

For example, when the first area is the left side of the vertical central line PVLA and the marker is formed in the first area (e.g. M21, M22 and M23 in FIG. 12), the first edge extending portion of the low pixel electrode may be cut by the second cutting line CL2B.

When the second area is the right side of the vertical central line PVLA and the marker is formed in the second area (e.g. M11, M12 and M13 in FIG. 12), a portion of the low pixel electrode at the right side of the high pixel electrode may be cut by a second cutting line CL2A.

For example, when the second area is the right side of the vertical central line PVLA and the marker is formed in the second area (e.g. M11, M12 and M13 in FIG. 12), the second edge extending portion of the low pixel electrode may be cut by the second cutting line CL2A.

According to the present exemplary embodiment, the display panel 100A includes the markers having relatively different positions in the pixels to easily repair the defective pixel although the pixel structure of the display panel 100A is complex. Thus, the productivity of the display panel 100A may increase. The manufacturing cost of the display panel 100A may be reduced.

According to the present inventive concept as explained above, the display panel includes the markers having relatively different positions in the pixels to easily repair the defective pixel although the pixel structure of the display panel is complex.

The foregoing is illustrative of the present inventive concept and is not to be construed as limiting thereof. Although a few exemplary embodiments of the present inventive concept have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of the present inventive concept and is not to be construed as limited to the specific exemplary embodiments disclosed, and that modifications to the disclosed exemplary embodiments, as well as other exemplary embodiments, are intended to be included within the scope of the appended claims. The present inventive concept is defined by the following claims, with equivalents of the claims to be included therein.

What is claimed is:

1. A display panel comprising:
   a gate layer including a gate pattern including a gate line and a gate electrode connected to the gate line, the gate layer further including a storage pattern spaced apart from the gate pattern;
   a data layer including a data line, a source electrode connected to the data line, and a drain electrode spaced apart from the source electrode;
   a pixel layer including a pixel pad portion electrically connected to the drain electrode through a contact hole, a pixel connecting portion extending from the pixel pad portion and at least partially positioned beyond a closed conductive structure of the storage pattern in a plan view of the display panel, and a pixel electrode electrically connected to the pixel pad portion through the pixel connecting portion, wherein the pixel electrode comprises a connecting branch directly connected to the pixel connecting portion; and a marker protruding from a first conductive edge of the storage pattern, spaced from the drain electrode in the plan view of the display panel, and overlapping with the connecting branch in the plan view of the display panel, wherein the first conductive edge of the storage pattern is positioned between the marker and the contact hole in the plan view of the display panel.

2. The display panel of claim 1, wherein a protrusion of the storage pattern protrudes from a second conductive edge of the storage pattern, overlaps a corresponding drain electrode of the data layer, and is wider than the marker in a lengthwise direction of the second conductive edge of the storage pattern, and the second conductive edge of the storage pattern is spaced from the first conductive edge of the storage pattern.

3. The display panel of claim 1, wherein the storage pattern includes a first extending portion extending in a horizontal direction and a second extending portion connected to the first extending portion and extending in a vertical direction, and the marker protrudes from the first extending portion and is spaced apart from the second extending portion.

4. The display panel of claim 3, wherein the marker protrudes from the first extending portion toward inside of the pixel electrode.

5. The display panel of claim 1, wherein the marker is disposed in one of a first area, a second area, a third area and a fourth area which are divided by a horizontal central line of the pixel electrode and a vertical central line of the pixel electrode.

6. The display panel of claim 5, wherein in a case that the marker is disposed in the first area, a first cutting line is disposed between a closest source electrode and a closest data line from a central point of the pixel electrode in a first diagonal direction which is toward the first area from the central point, in a case that the marker is disposed in the second area, the first cutting line is disposed between a closest source electrode and a closest data line from the central point of the pixel electrode in a second diagonal direction which is toward the second area from the central point, in a case that the marker is disposed in the third area, the first cutting line is disposed between a closest source electrode and a closest data line from the central point of the pixel electrode in a third diagonal direction which is toward the third area from the central point, and in a case that the marker is disposed in the fourth area, the first cutting line is disposed between a closest source electrode and a closest data line from the central point of the pixel electrode in a fourth diagonal direction which is toward the fourth area from the central point.

7. The display panel of claim 5, wherein the pixel electrode comprises:

a first bar portion extending in the vertical direction and overlapping the vertical central line; and a second bar portion extending in the horizontal direction and overlapping the horizontal central line, wherein a section of the connecting branch is positioned between the marker and the pixel connecting portion in the plan view of the display panel, and wherein the first bar portion is electrically connected through the section of the connecting branch to the pixel connecting portion.

8. The display panel of claim 7, wherein in a case that the marker is disposed in an upper side with respect to the horizontal central line of the pixel electrode, the connecting branch is disposed at an upper portion of the pixel electrode and a second cutting line is disposed below the connecting branch on the first bar portion, and in a case that the marker is disposed in a lower side with respect to the horizontal central line of the pixel electrode, the connecting branch is disposed at a lower portion of the pixel electrode and the second cutting line is disposed above the connecting branch on the first bar portion.

9. The display panel of claim 5, wherein the display panel comprises a pixel repeating group including twelve pixels in two pixel rows and six pixel columns and repeated in the display panel, the pixel repeating group includes:

a first pixel row including first to sixth pixels sequentially disposed; and a second pixel row including seventh to twelfth pixels sequentially disposed, the first pixel is connected to a first gate line and a second data line, the second pixel is connected to a second gate line and the second data line, the third pixel is connected to the first gate line and a third data line, the fourth pixel is connected to the second gate line and the third data line, the fifth pixel is connected to the second gate line and a fourth data line, the sixth pixel is connected to the first gate line and the fourth data line, the seventh pixel is connected to a third gate line and a first data line, the eighth pixel is connected to a fourth gate line and the first data line, the ninth pixel is connected to the third gate line and the second data line, the tenth pixel is connected to the fourth gate line and the second data line, the eleventh pixel is connected to the fourth gate line and the third data line, and the twelfth pixel is connected to the third gate line and the third data line.

10. The display panel of claim 9, wherein a first marker of the first pixel is disposed in the second area, a second marker of the second pixel is disposed in the fourth area, a third marker of the third pixel is disposed in the second area, a fourth marker of the fourth pixel is disposed in the fourth area, a fifth marker of the fifth pixel is disposed in the fourth area, a sixth marker of the sixth pixel is disposed in the second area, a seventh marker of the seventh pixel is disposed in the first area, an eighth marker of the eighth pixel is disposed in the third area, a ninth marker of the ninth pixel is disposed in the first area, a tenth marker of the tenth pixel is disposed in the third area, an eleventh marker of the ninth pixel is disposed in the third area, and a twelfth marker of the twelfth pixel is disposed in the first area.

11. The display panel of claim 1, wherein the marker is disposed in one of a first area and a second area which are divided by a vertical central direction.

12. The display panel of claim 11, wherein the pixel electrode includes a low pixel electrode disposed at an upper portion of the pixel electrode and a high pixel electrode disposed at a lower portion of the pixel electrode, the pixel pad portion includes a low pixel pad portion configured to apply a data voltage to the low pixel electrode and a high pixel pad portion configured to apply the data voltage to the high pixel electrode, the pixel connecting portion includes a low pixel connecting portion connecting the low pixel electrode and the low pixel pad portion and a high pixel connecting portion connecting the high pixel electrode and the high pixel pad portion, and the low pixel connecting portion is disposed at one of a left side with respect to the high pixel electrode and a right side with respect to the high pixel electrode according to a position of the pixel.

13. The display panel of claim 12, wherein in a case that the first area is the left side with respect to the vertical central line of the pixel electrode and the marker is disposed in the first area, a portion of the low pixel electrode at the left side with respect to the high pixel electrode is cut, and in a case that the second area is the right side with respect to the vertical central line of the pixel electrode and the marker is disposed in the second area, a portion of the low pixel electrode at the right side with respect to the high pixel electrode is cut.

14. The display panel of claim 1, wherein the marker is surrounded by a first-direction central line of the pixel electrode, a second-direction central line of the pixel electrode, a first-direction section of the closed conductive structure of the storage pattern, and a second-direction section of the closed conductive structure of the storage pattern in the plan view of the display panel, and wherein the first conductive edge of the storage pattern is positioned between the marker and an edge of the pixel connecting portion in the plan view of the display panel.

15. A display panel comprising:

a gate layer including a gate pattern including a gate line and a gate electrode connected to the gate line and a storage pattern spaced apart from the gate pattern;

a data layer including a data line, a source electrode connected to the data line and a drain electrode spaced apart from the source electrode;

a pixel layer including a pixel pad portion connected to the drain electrode through a contact hole, a pixel connecting portion extending from the pixel pad portion and a pixel electrode connected to the pixel pad portion through the pixel connecting portion; and a marker having a relative position according to a position of the pixel electrode in the display panel, wherein the marker overlaps the pixel electrode, wherein the marker is disposed in one of a first area, a second area, a third area and a fourth area which are divided by a first-direction central line of the pixel electrode and a second-direction central line of the pixel electrode, wherein in a case that the marker is disposed in the first area, a first cutting line is disposed between a closest source electrode and a closest data line from a central point of the pixel electrode in a first diagonal direction which is toward the first area from the central point, in a case that the marker is disposed in the second area, the first cutting line is disposed between a closest source electrode and a closest data line from the central point of the pixel electrode in a second diagonal direction which is toward the second area from the central point, in a case that the marker is disposed in the third area, the first cutting line is disposed between a closest source electrode and a closest data line from the central point of the pixel electrode in a third diagonal direction which is toward the third area from the central point, and in a case that the marker is disposed in the fourth area, the first cutting line is disposed between a closest source electrode and a closest data line from the central point of the pixel electrode in a fourth diagonal direction which is toward the fourth area from the central point.

* * * * *